(12) United States Patent
Daughton et al.

(10) Patent No.: US 6,538,921 B2
(45) Date of Patent: Mar. 25, 2003

(54) CIRCUIT SELECTION OF MAGNETIC MEMORY CELLS AND RELATED CELL STRUCTURES

(75) Inventors: James M. Daughton, Eden Prairie, MN (US); Arthur V. Pohm, Ames, IA (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 09/929,435

(22) Filed: Aug. 14, 2001

(65) Prior Publication Data

US 2002/0036919 A1 Mar. 28, 2002

Related U.S. Application Data

(60) Provisional application No. 60/225,966, filed on Aug. 17, 2000.

(51) Int. Cl.[7] .............................................. G11C 11/14
(52) U.S. Cl. ....................................... 365/171; 365/170
(58) Field of Search ............................ 365/170, 171, 365/173, 158

(56) References Cited

U.S. PATENT DOCUMENTS

| | | | |
|---|---|---|---|
| 5,343,422 A | 8/1994 | Kung et al. ................. | 365/173 |
| 5,347,485 A | 9/1994 | Taguchi et al. ............. | 365/171 |
| 5,477,482 A | 12/1995 | Prinz .......................... | 365/129 |
| 5,541,868 A | 7/1996 | Prinz .......................... | 365/98 |
| 5,640,343 A | 6/1997 | Gallagher et al. .......... | 365/171 |
| 5,650,958 A | 7/1997 | Gallagher et al. .......... | 365/173 |
| 5,734,605 A | 3/1998 | Zhu et al. ................... | 365/173 |
| 5,949,707 A | 9/1999 | Pohm et al. ................ | 365/158 |
| 5,966,322 A | 10/1999 | Pohm et al. ................ | 365/158 |
| 5,978,257 A | 11/1999 | Zhu et al. ................... | 365/173 |
| 6,021,065 A | 2/2000 | Daughton et al. .......... | 365/158 |
| 6,124,711 A | 9/2000 | Tanaka et al. .............. | 324/252 |
| 6,147,900 A | 11/2000 | Pohm ......................... | 365/158 |
| 6,275,411 B1 | 8/2001 | Daughton et al. .......... | 365/158 |

OTHER PUBLICATIONS

A. Veloso and P.P. Freitas. Spin Valve Sensors wtih Synthetic Free and Pinned Layers. *Journal of Applied Physics*, vol. 87 No. 9, 5744–5746, May 1, 2000.
A. Veloso, P.P. Freitas, and L.V. Melo. Spin Valves with Synthetic Ferrimagnet and Antiferromagnet Free and Pinned Layer. IEEE Trans. Magn. 35, 2568 (1999).
V.S. Speriosu, B.A. Gurney, D.R. Wilhoit, and L.B. Brown. Spin Valves with Synthetic Ferrimagnets. Presented at Intermag '96.

*Primary Examiner*—Vu A. Le
(74) *Attorney, Agent, or Firm*—Kinney & Lange, P.A.

(57) ABSTRACT

A ferromagnetic thin-film based digital memory having a plurality of bit structures interconnected with manipulation circuitry having a plurality of transistors so that each bit structure has transistors electrically coupled thereto that selectively substantially prevents current in at least one direction along a current path through that bit structure and permits selecting a direction of current flow through the bit structure if current is permitted to be established therein. A bit structure has a nonmagnetic intermediate layer with two major surfaces on opposite sides thereof and a memory film of an anisotropic ferromagnetic material on each of the intermediate layer major surfaces with an electrically insulative intermediate layer is provided on the memory film on which a magnetization reference layer is provided having a fixed magnetization direction.

100 Claims, 11 Drawing Sheets

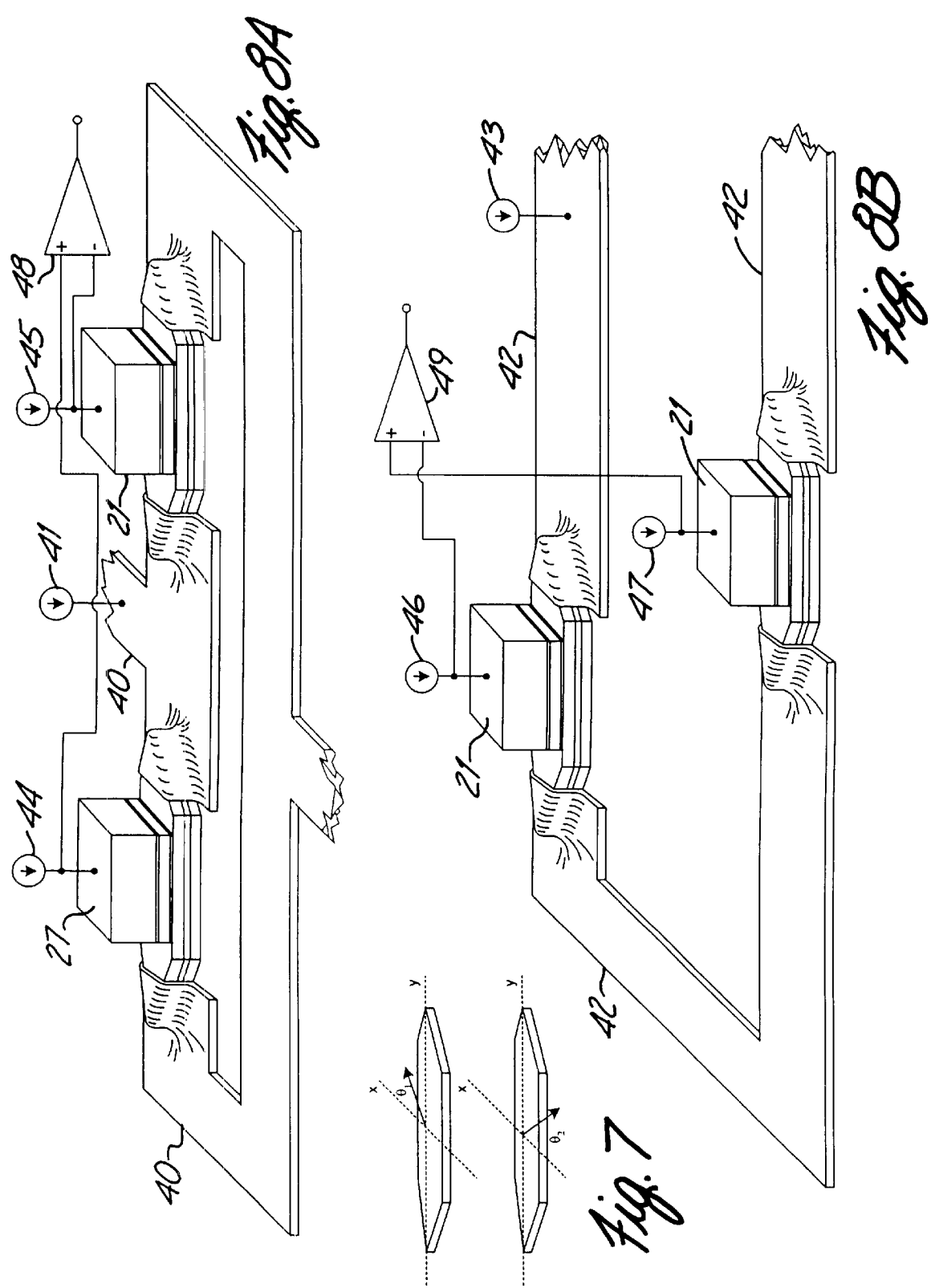

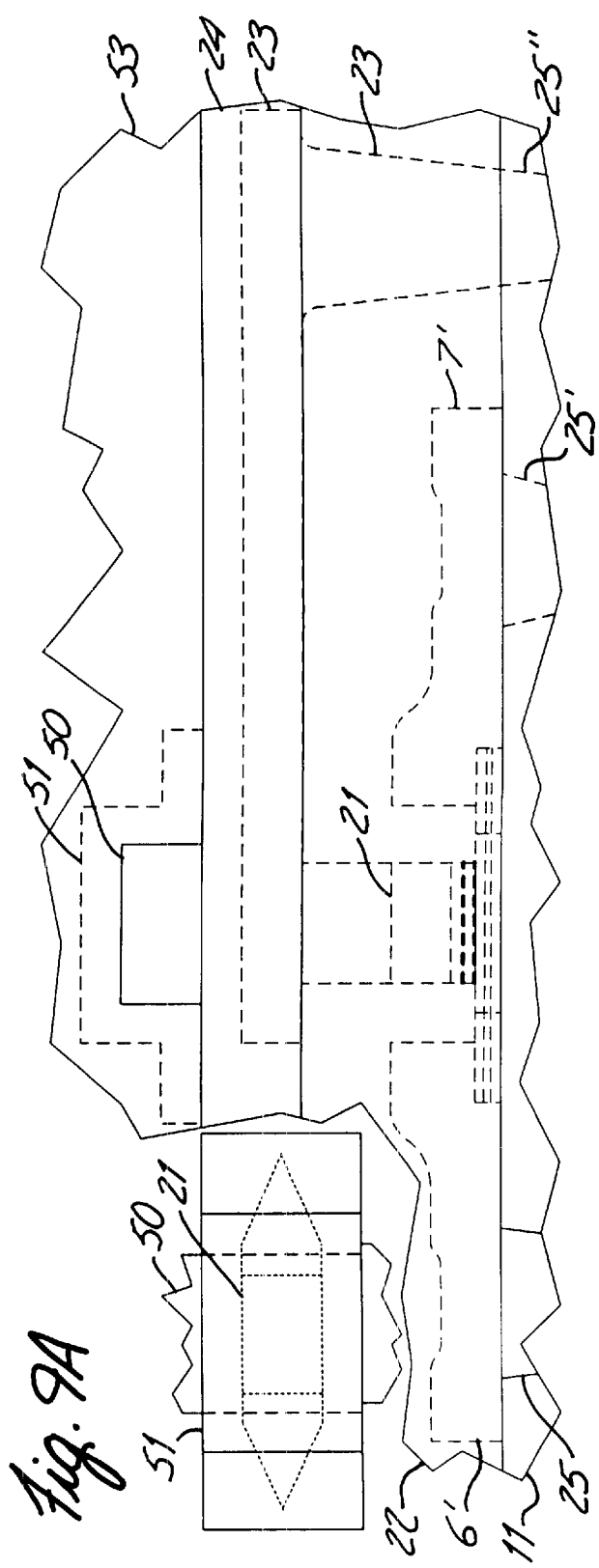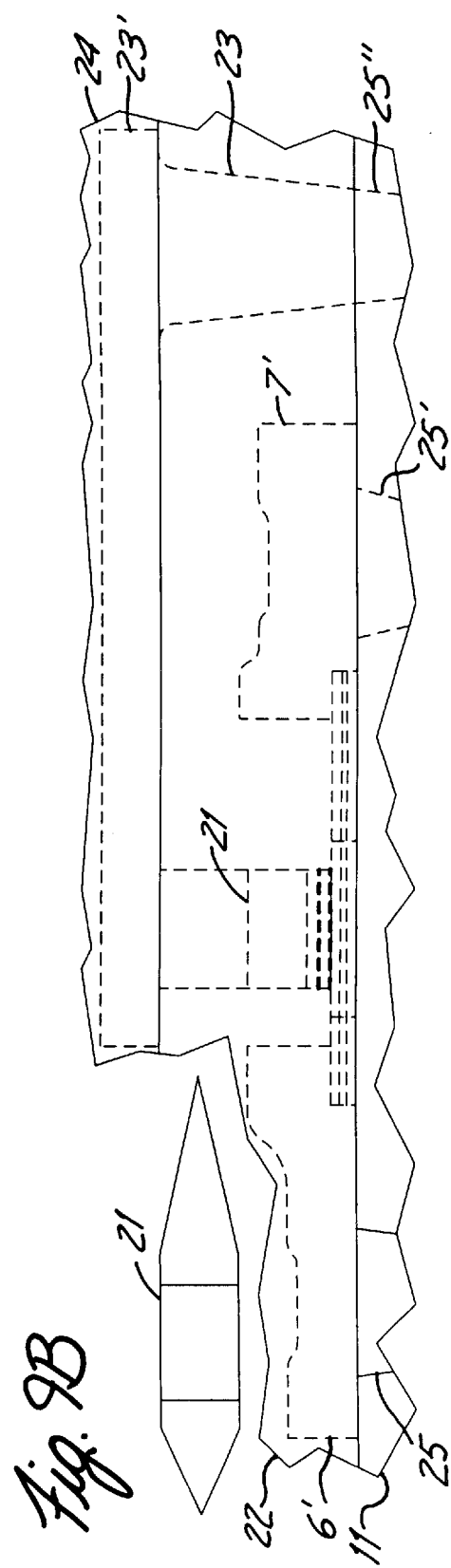

CIRCUIT SELECTION OF MAGNETIC MEMORY CELLS AND RELATED CELL STRUCTURES

RELATED APPLICATIONS

This application claims the benefit of Provisional Application No. 60/225,966 filed Aug. 17, 2000 for "CIRCUIT SELECTION OF MAGNETIC MEMORY CELLS".

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and low power dissipation by substituting an electrical insulator for a conductor in the nonmagnetic layer. This memory cell can be fabricated using ferromagnetic thin-film materials of similar or different kinds in each of the magnetic memory films used in a "sandwich" structure on either side of an intermediate nonmagnetic layer which ferromagnetic films may be composite films, but this intermediate nonmagnetic layer conducts electrical current therethrough based primarily on a quantum electrodynamic effect "tunneling" current.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers which are set by their magnetization directions to provide a "magnetic valve effect". Such an effect results in an effective resistance or conductance characterizing this intermediate layer with respect to the "tunneling" current therethrough. In addition, shape anisotropy is used in such a cell to provide different magnetization switching thresholds in the two ferromagnetic layers by forming one of the ferromagnetic layers to be thicker than the other. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

As stated above, operating magnetic fields imposed externally can be used to vary the angle of the magnetization vector with respect to the easy axis in the ferromagnetic films of these various kinds of memory cell devices. Such operational magnetic fields imposed externally can be used to vary the angle to such an extent as to cause switching of the film magnetization vector between two stable states which occur for the magnetization being oriented in opposite directions along the film's easy axis, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This scheme is based on selective externally imposed magnetic fields provided by selectively directing electrical currents over or through sequences of such cells so that selection of a cell occurs through coincident presences of such fields at that cell.

Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult. FIG. 1 is a diagram representing such a data storage selection scheme having memory cells, represented by rectangle-like structures with triangle-like structures on the left and right ends thereof, having crossing current conductors, represented by lines (including the dashed line portions over the cells in the horizontal lines), forming a grid of such conductors arranged to provide two conductors crossing in the vicinity of each cell (or, in the alternative, the horizontal conductors may be in portions connected together by the cells so that the horizontal dashed lines over the cells are ignored). Thus, the crossing conductors for storing data in the cells may be parallel sense lines each connecting the cells along it in series with one another with the remaining lines perpendicular thereto being word lines each merely passing near to the cells along it or, alternatively, both perpendicular sets of lines for writing may be word lines each passing near to the cells along it (with a further set of sense lines connecting the cells in rows in series with one another not shown also being provided). The horizontal conductors n−1, n, n+1 can have corresponding ones of electrical currents . . . $I_{xn-1}$, $I_{xn}$, $I_{xn+1}$ . . . established in them by selective switching, and vertical conductors m−1, m, m+1 can have corresponding ones of electrical currents . . . $I_{ym-1}$, $I_{ym}$, $I_{ym+1}$ . . . established in them by selective switching.

In operation, each cell, when not to be selected for a state imposition therein, has no currents in the pair of conductors crossing adjacent to them or has current in only one of that pair, either of the $I_x$ or $I_y$ corresponding currents. A selected cell, on the other hand, coincidently receives both of the $I_x$ and $I_y$ corresponding currents along the two perpendicular lines crossing by it in FIG. 1, and is thereby switched into the desired memory state by the coincident magnetic fields generated by each of these currents. These currents, however, must be selected so that neither of the $I_y$ or $I_x$ corresponding currents by itself disturbs the memory state of any of the cells along the conductor carrying that current because all of the others store currently wanted data. Memory cells along a conductor carrying a current $I_x$ or memory cells along a conductor carrying a current $I_y$ that are not being written are subjected to such "half-select" currents, either of the $I_x$ or $I_y$ corresponding currents, which will contribute magnetic fields which increase the chances of combining with other unwanted magnetic fields that on occasion may be present to thereby disturb the states of those memory cells, and so the data stored therein.

If very large currents are used to insure the writing of the highest switching threshold cells, then the half-select currents are correspondingly large and tend to increase the chances of memory cell state disturbances in the lowest switching threshold, or most disturbance sensitive, cells. Thus, the states of the half-selected memory cells are not nearly as stable in storing the bit values therein, and they provide the majority of projected cell data storage failures over time. In addition to half-select currents, these cells must withstand stray magnetic fields from neighboring cells, fields from leakage currents and stray environmental fields. Hence, there is a need to have the switching thresholds of the highest switching threshold cells not be too different from the switching thresholds of the lowest switching threshold cells, and so the resulting requirements for switching threshold uniformity and small switching current design margins tend to make memories implementing the coincident interjected magnetic fields memory cell state selection scheme difficult to manufacture.

The various magnetoresistive memory cell types mentioned above also use a coincident interjected magnetic fields memory cell state selection scheme selection scheme for retrieving stored data. The original MRAM concept cell, based on the anisotropic magnetoresistive effect, and the pseudo-spin valve concept cell, based on the "giant magnetoresistive effect", both use magnetic such selection schemes for data retrievals, which introduce further data disturbance opportunities through again generating magnetic fields that can combine with unwanted magnetic fields that appear. Magnetic tunnel junction memories often use a diode or transistor to select a memory cell for data retrievals, and thus do not introduce significant data disturbance conditions for such retrievals, but they still have the constraints of coincident interjected magnetic fields memory cell state selection scheme for data storage. Thus, there is a desire for a memory cell configuration and corresponding memory cell selection arrangement that allows providing magnetoresistive based memories that are more easily manufacturable but still having the memory cells therein provided with a large areal density.

BRIEF SUMMARY OF THE INVENTION

The present invention provides a ferromagnetic thin-film based digital memory having a plurality of bit structures interconnected with manipulation circuitry having a plurality of transistors so that each bit structure has a selection transistor electrically coupled thereto that selectively substantially prevents current in at least one direction along a current path through that bit structure with each bit structure having a nonmagnetic intermediate layer with two major surfaces on opposite sides thereof and a memory film of an anisotropic ferromagnetic material on each of the intermediate layer major surfaces. An electrically insulative intermediate layer is provided on the memory film and across said memory film from one of said intermediate layer major surfaces, this intermediate layer having a major surface on a side opposite the memory film on which a magnetization reference layer is provided having a fixed magnetization direction. The manipulation circuitry includes switching transistors to permit selecting the direction of current flow through a bit structure if permitted by the corresponding a selection transistor.

BRIEF DESCRIPTION OF THE DRAWINGS

FIG. 7 shows a coordinate diagram for a representation of a portion of the memory cell structure of FIG. 6, FIGS. 8A and 8B show a partial perspective view of plural memory cell structures in part of a memory cell, FIGS. 9A and 9B show memory cell structures suited for use in the circuits of FIGS. 3 and 4.

DETAILED DESCRIPTION

Figure 2:
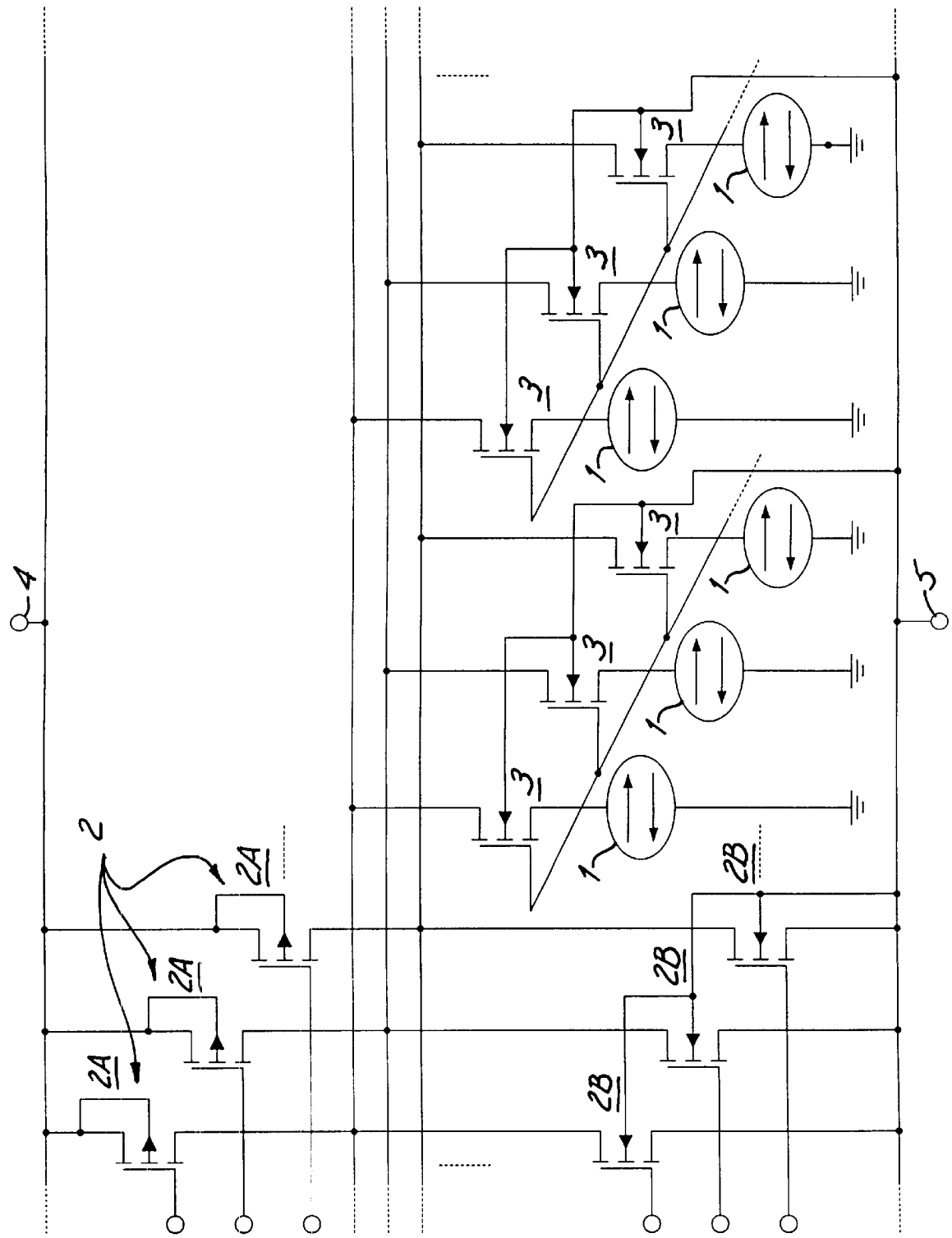
FIGS. 2 and 3 show memory cell selection circuits based on using circuit switching to select a memory cell and the direction of current permitted therein.

FIG. 2 depicts a representation of a memory cell switch based selection scheme for both storing and retrieving data in magnetoresistive memory cells such as in the kinds of cells described above. A sufficiently large electrical current for storing binary data is conducted through selected memory cells, 1, in one direction or the other (such as a selected plus direction current for a binary "1" value and a corresponding negative direction current for a binary "0" value) as provided by a corresponding selected current direction selection circuit, 2. Such data storing currents are provided through both a selection switch provided by a transistor and the corresponding series connected memory cell 1 (shown as an elliptically shaped symbol for a "giant magnetoresistive effect" based memory cell) connected in series therewith to set the desired magnetic state in that cell, i.e. to provide storage of a binary bit therein by storing a selected one of two binary values therein.

Current direction selection circuits 2 (only three of which are shown as examples as there will typically be many more) each have the drain of a p-channel metal-oxide-semiconductor field-effect transistor (MOSFET), 2A, and the drain of a n-channel MOSFET, 2B, connected together and to one end of each of a set of switch controlled memory cell branch circuits (only two of which sets are shown as examples with only three cells shown in each set, again as examples, as there will typically be many more sets and many more cells in a set). These branch circuits have the opposite ends of each connected to ground, there being a memory cell 1 in series with a selection switch, 3, provided by a n-channel MOSFET in each such branch circuit. Each current direction selection circuit 2 p-channel MOSFET 2A has its source connected to a terminal, 4, suited for connection to a positive supply voltage source, and each n-channel MOSFET 2B has its source connected to a terminal, 5, suited for connection to a negative supply voltage source, and the gates of all current direction selection circuits MOSFET's are connected to control circuitry not shown. Alternatively, to permit using a voltage supply source with only a single polarity, terminal 5 can be connected ground and the ends of the branch circuits shown connected to ground can instead be connected to a fixed voltage that is a fraction of the positive voltage supplied on terminal 4.

A smaller current for retrieving such data is alternatively passed through a memory cell 1 by the corresponding selected current direction selection circuit 2, that is, through both the corresponding selection transistor 3 and the corresponding memory cell 1, in one direction to generate a voltage across that cell which will be of a higher or lower value depending on the binary value of the data stored and so upon the corresponding magnetoresistance of the cell. This sensed voltage is then compared to a reference to determine the stored memory state currently present in that cell.

In storing data in a selected memory cell 1 in this arrangement, the terminating region of switching transistor 3 not connected to that memory cell 1 in series therewith is selectively switched to a positive voltage by p-channel MOSFET 2A of the current direction selection circuit 2 connected thereto to provide current therethrough in one direction, or alternatively to a negative voltage by the corresponding n-channel MOSFET 2B, to provide current in an in opposite direction therethrough. Concurrently, an appropriate voltage is provided on the gate of that transistor 3 to allow a magnetic state setting current therethrough in a corresponding direction through that memory cell. A smaller current in just one of the current direction through that memory cell 1 is provided to retrieve data stored therein. If that cell 1 is not to be selected for storing data therein or retrieving data therefrom, the gate of the corresponding switching transistor 3 is switched to ground to prevent current conduction therethrough.

Figure 1:
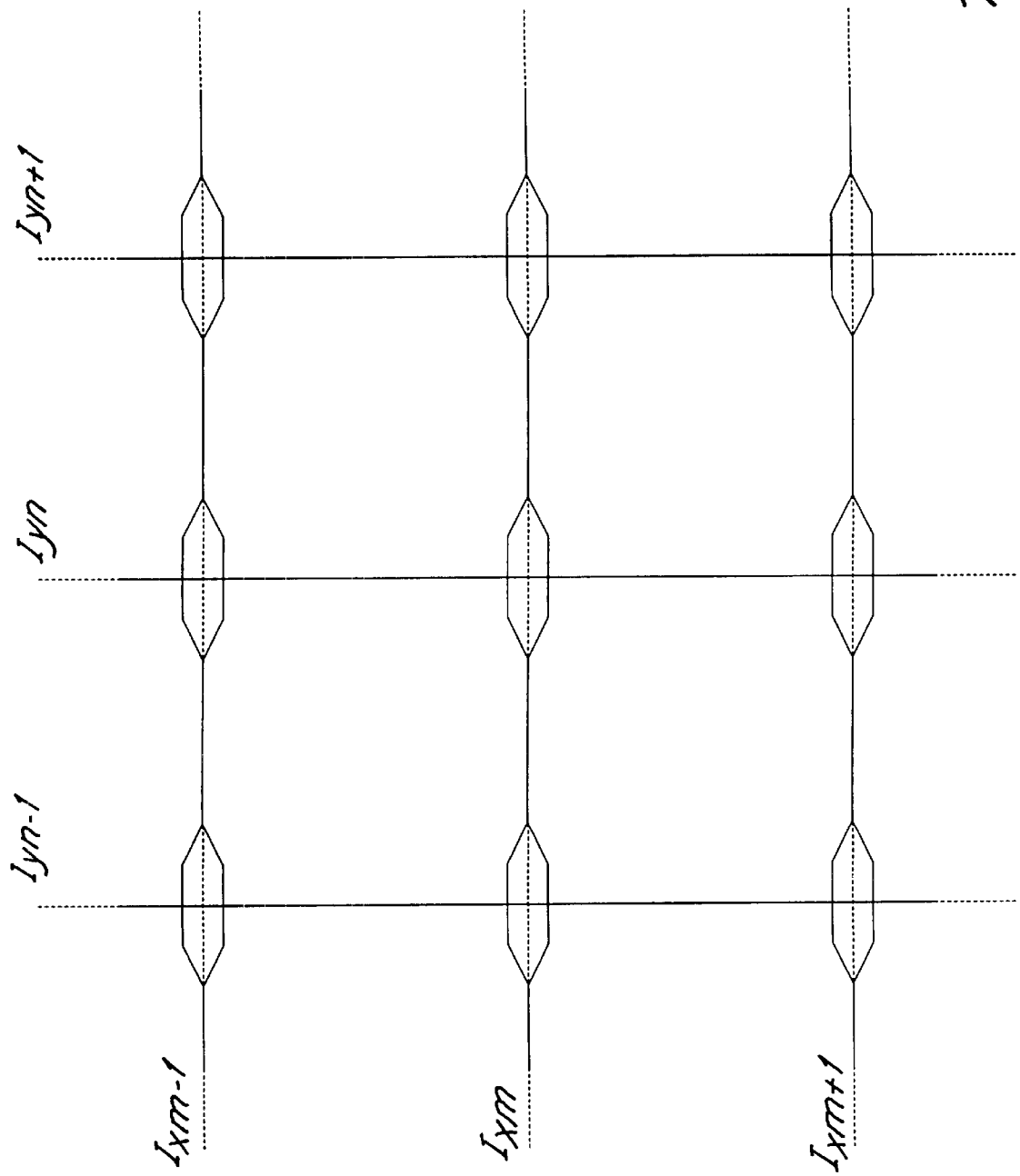
FIG. 1 shows a memory cell selection arrangement based on providing magnetic fields coincidently at the selected cell to effect such a selection thereof.

Thus, such circuit switching provides the selection of a memory cell for storing data, and not the coincidence of externally imposed magnetic fields at that cell as in the memory cell state selection scheme of FIG. 1 which is based on the magnetic switching properties of the cells in externally applied magnetic fields. No word lines are provided passing near memory cells, and no sense lines are used to connect memory cells in series with one another as in FIG. 1. A large current can be used to store data and a smaller current can be used to retrieve data from the cell, thus providing potentially very large margins between the storing currents and the retrieving currents but still using as small a storing current as will reliably store data in the cell so as to reduce the size of the transistor needed for selection.

Figure 3:
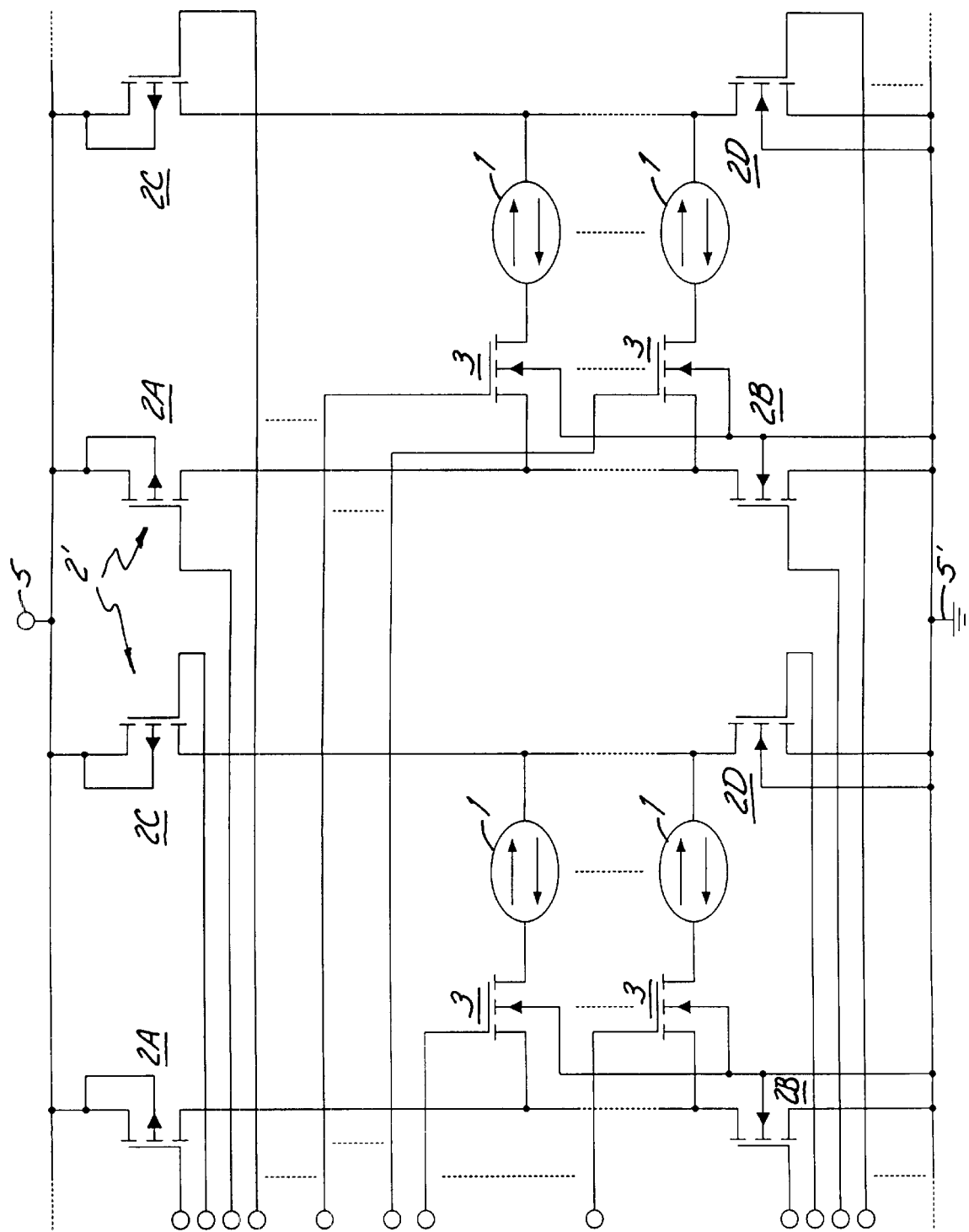

An alternative memory cell selection arrangement that also requires only a voltage supply source with a single polarity is shown in FIG. 3. There, current direction selection circuits, 2', are shown (only two of which are shown as examples as there will typically be many more) connected between positive supply voltage source terminal 5 and a ground reference terminal, 5'. Each of current direction selection circuits 2' again has the drain of p-channel (MOSFET) 2A, and the drain of n-channel MOSFET 2B connected together and to one end of each of a set of switch controlled memory cell branch circuits (only two of which are shown as examples with only two cells shown in each set, again as examples, as there will typically be many more sets and many more cells in a set). These branch circuits, however, have the opposite ends of each connected to the connected drains of two other MOSFET's, 2C and 2D, there again being a memory cell 1 in series with a corresponding selection switch 3 provided by a n-channel MOSFET in each such branch circuit. Each of current direction selection circuits 2' has the sources of its p-channel MOSFET's 2A and 2C connected to terminal 4, and each has the sources of its n-channel MOSFET's 2B and 2D connected to terminal 5', and the gates of all current direction selection circuits MOSFET's are again connected to control circuitry not shown.

In storing data in a selected memory cell 1 in this arrangement, the terminating region of switching transistor 3 not connected to that memory cell 1 in series therewith is again selectively switched to a positive voltage by p-channel MOSFET 2A of the current direction selection circuit 2' connected thereto with the other end of that branch circuit switched to ground by n-channel MOSFET 2D to provide current therethrough in one direction, or alternatively, the terminating region of switching transistor 3 not connected to that memory cell 1 in series therewith is selectively switched to ground by n-channel MOSFET 2B with the other end of that branch circuit switched to terminal 4 by p-channel MOSFET 2C, to provide current in an in opposite direction therethrough. Concurrently, an appropriate voltage is again provided on the gate of that transistor 3 to allow a magnetic state setting current therethrough in a corresponding direction through that memory cell. A smaller current in just one of the current direction through that memory cell 1 is provided to retrieve data stored therein. If that cell 1 is not to be selected for storing data therein or retrieving data therefrom, the gate of the corresponding switching transistor 3 is switched to ground to prevent current conduction therethrough.

Figure 4:
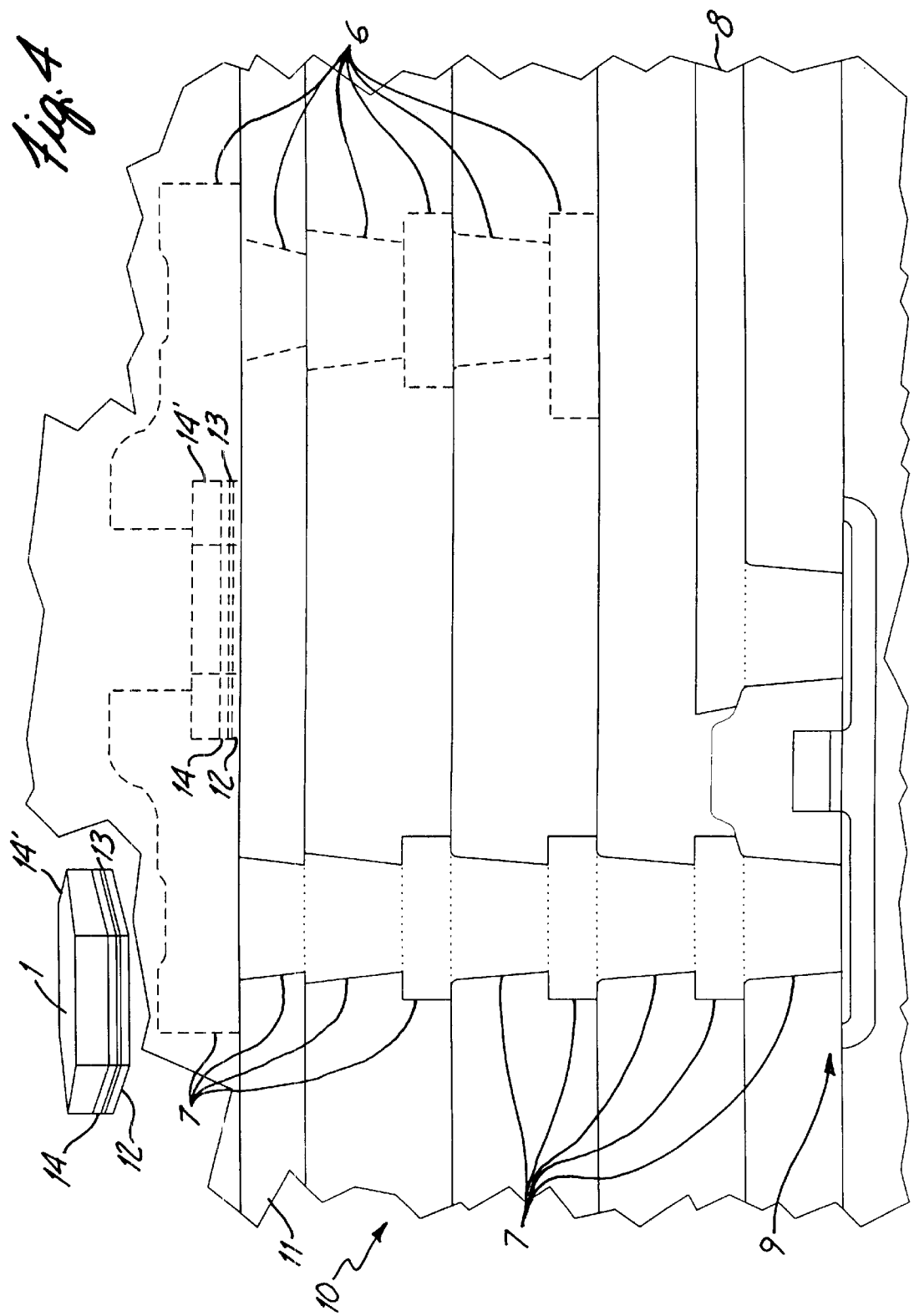
FIGS. 4, 5 and 6 show memory cell structures suited for use in the circuits of FIGS. 3 and 4.

FIG. 4 shows a layer diagram of a portion of a monolithic integrated circuit implementation of a magnetoresistive memory cell 1 which can be used in the memory cell switching circuit based selection schemes of FIGS. 2 and 3. This layer diagram gives an indication of the structural layers, but is not a true cross section view in that many dimensions there are exaggerated or reduced relative to one another for purposes of clarity. A perspective view of just the cell structure of cell 1 is shown in the upper left hand corner of the figure.

Memory cell 1 is shown interconnected by interconnections, 6, 7 and 8, in and through several metal interconnection layers all insulated from one another except where interconnected which are all formed on a semiconductor material substrate having a MOSFET, 9, to provide a suitable type of a known monolithic integrated circuit chip structure, 10. Such a chip, in turn, is provided with a mechanical-chemical polished layer, 11, thereon so that they together serve as a substrate to support a magnetoresistive material based memory cell structure. This cell structure (shown in dashed line form in being set back from the plane of the figure) has an unpinned ferromagnetic layer, 12, formed to include an easy axis across its width, with a conductive metal layer, 13, provided thereon having a further ferromagnetic layer, 14, with its magnetization direction pinned across its width by an antiferromagnetic layer, 14', provided on it to form a spin valve structure as memory cell 1.

In storing data in this cell structure by setting the magnetization direction of unpinned layer 12 in one direction or the other along its easy axis (i.e. setting its magnetic state), a sufficiently large current is provided through the spin valve "sandwich" structure of memory cell 1 from interconnection 6 made to a voltage supply arrangement having a switchable polarity, and leading to the cell structure. Interconnection 7 leads from the cell structure to a terminating region (here the drain) of n-channel MOSFET 9 provided in monolithic integrated circuit structure 10, which controls the application of current through this cell structure by controlling the conductivity of the path to the power supply return to which it is connected by interconnection 8 connected ti its remaining terminal region (here the source).

The direction of electrical current through this cell structure determines which memory state is imposed in cell 1. The magnetization in unpinned ferromagnetic layer 12 in the cell structure will tend to align clockwise (right hand rule) around the storage current provided through the "sandwich" structure. The magnetization of unpinned layer 12 will then either be in alignment with or antiparallel to the magnetization direction of pinned layer 14, to provide either a higher or lower cell structure magnetoresistance and so either a "1" or a "0" binary value. A lower magnitude retrieval current can then be subsequently passed through the cell as a sense current, and the voltage across the cell can then measured to determine whether a higher or lower resistance is present in the cell, and so the memory state of the cell. This sense current may be arbitrarily low to detect the state of the data stored, but the data retrieval time will increase at lower currents as the bandwidth of the sense amplifier will have to be decreased to reduce noise to thereby maintain an acceptable signal-to-noise ratio per bit (bit energy-to-noise power ratio).

However, the memory cell structure of FIG. 4 is a relatively "open flux" structure as to the flux established thereabout insofar as this flux being contained within the structure which would result in cells of this construction being limited to some extent in areal density to thereby avoid having the flux of one intersect and interfere with neighboring cells to too great an extent. In addition, a large value for the storage current is required leading to needing a large area selection transistor because the "open flux" structure leads to large demagnetization fields in unpinned, or "free", ferromagnetic layer 12 having to be overcome to switch the magnetization direction therein to the opposite magnetic state in a data storage operation. In memory cell 1, the shape anisotropy, which is approximately $4\pi M_s$ T/T+W where $M_s$ is the ferromagnetic material magnetic saturation value, T is the thickness of layer 12, and W is the width of that layer (and the cell). The ferromagnetic layer material anisotropy must be added to this shape anisotropy value to obtain the total demagnetization field to be overcome, and, for a 1.0 $\mu$m wide cell, a typical value would be 75 Oe. Nevertheless, such a cell structure can be used in the memory cell switch based selection schemes of FIGS. 2 and 3 for both storing and retrieving data.

Figure 5:
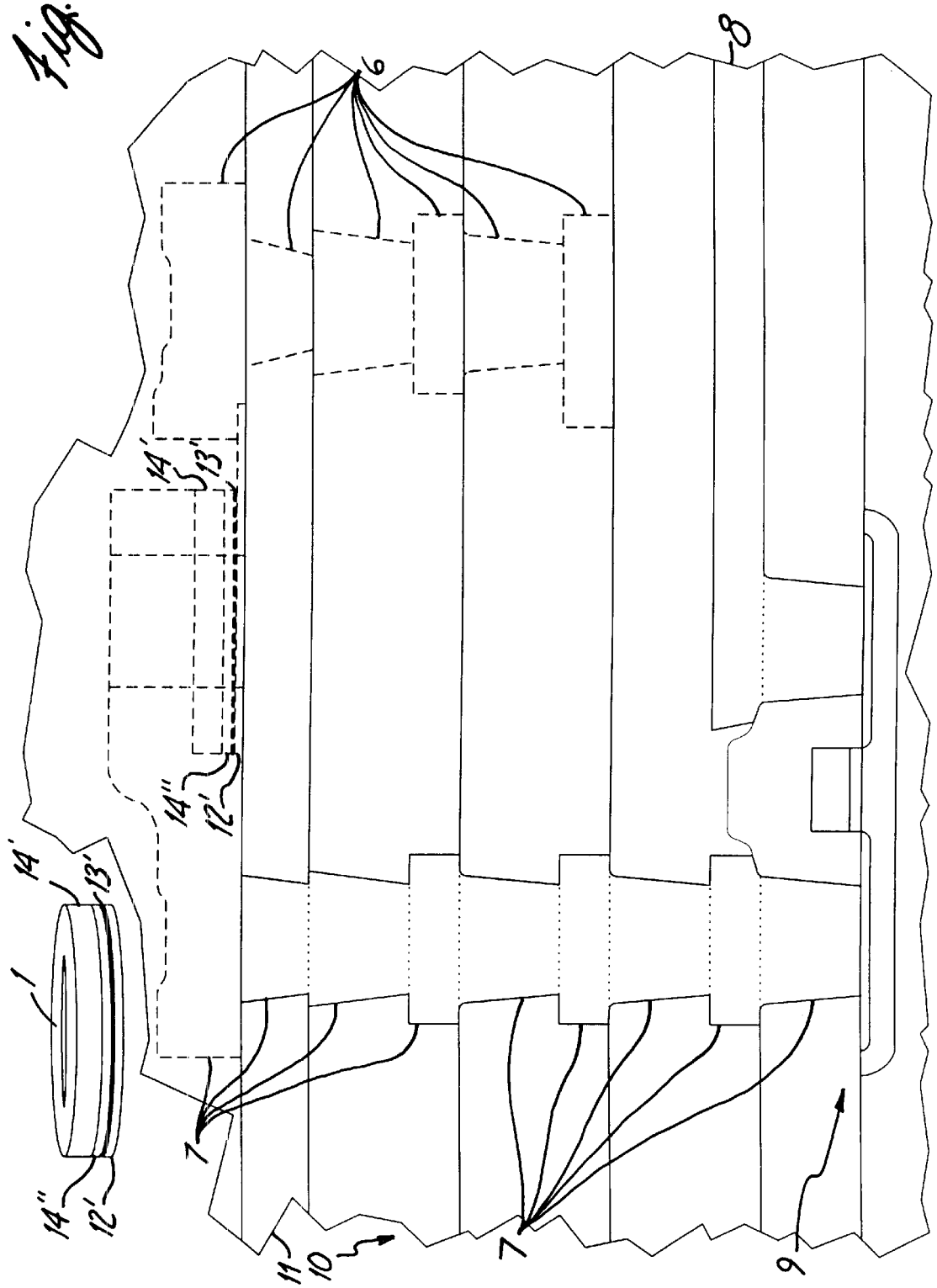

FIG. 5 shows a layer diagram for an alternative magnetoresistive memory cell 1 to be used in the memory cell switching circuit based selection schemes of FIGS. 2 and 3 having a much more "closed flux" structure, at least in situations other than those involving storing new data in the cell, this cell being in the form of a ring shaped magnetic tunnel junction cell (although a spin valve structure could be used instead) having a pair of ferromagnetic (permalloy, typically) layers, 12' and 14", on either side of an electrically insulating material barrier layer, 13', that also has antiferromagnetic "pinning" layer 14' on "pinned" ferromagnetic layer 14" (to set and maintain its circumferential direction). A centrally located hole extends through all of these layers without magnetic material being contained therein. Again, a perspective view of just the cell structure of cell 1 is shown in the upper left hand corner of FIG. 5.

A uniform current density about this hole through the major faces of the ring layers between interconnections 6 and 7 (having a ring shape also where provided at ferromagnetic layer 12' and antiferromagnetic layer 14') creates a circumferentially directed magnetic field, directed either clockwise or counterclockwise depending on the direction of the current through the ring layers. Such circumferential fields force the magnetizations of free ferromagnetic layer (layer 12') to tend to follow in the same direction as the field around the ring and, if sufficiently large to exceed the cell switching threshold, thereby set the cell in one of the two possible the cell magnetic states much in the manner of a discrete magnetic core cell.

However, during the switching of the circumferential magnetization of this free layer between the two alternative direction requires that the magnetization of the layer temporarily approach, attain and then go beyond having a radial direction which leads to the temporary occurrence of increasing and then decreasing demagnetization fields. These demagnetization fields having a maximum value proportional to the ratio of the free ring thickness to the sum of the free ring thickness and width which will again lead to a total demagnetization field to be overcome in switching having a typical value on the order again of 75 Oe. On the other hand, low values of sense currents can be used in retrieving stored information, i.e. the cell magnetic state, because of the relatively high resistance values of tunnel junctions.

In an alternative method of storing data in the ring memory cell 1 of FIG. 5, the tunnel junction can have a low enough resistance-area product and sufficient thermal resistance to the supporting substrate so that the heating provided by the maximum write current through the that junction is sufficient to permit the cell to reach the Néel temperature of antiferromagnet layer 14'. This antiferromagnetic material in that pinning layer can have a magnetic ordering temperature (or Néel temperature) which then can be attained by Joule heating through using a sufficiently high storage current. The heat generated by such a storage current would heat this layer past this temperature to cause the magnetization of the layer to become randomly oriented so that adjacent ferromagnetic layer 14", the "pinned" magnetization layer, becomes unpinned, and the direction of the magnetization in this adjacent layer can be set into either of two alternative circumferential directions, depending on the direction of the storage current, as that current, and so the heating and layer temperature is thereafter decreased. As this storage current is subsequently reduced in magnitude, the temperature of the antiferromagnetic pinning layer drops below its Néel temperature (with the magnetic field generated by this reduced storage current still occurring though reduced), and so that layer 14" next to antiferromagnetic layer 14' is re-pinned to the desired magnetic state which will remain quite stable until another storage current pulse is applied. The resulting magnetizations in either circumferential direction will be essentially confined to the ferromagnetic ring to thus form a "closed" flux structure and so cause no stray magnetic fields in the space outside the ring.

The resistance state of the disk shaped cell representing the stored information depends on the direction of the magnetization of free layer 12' with respect to that of pinned layer 14", and may be sensed by using relatively small sense currents (small enough to keep the cell temperature under the Néel temperature of antiferromagnet layer 14'). This sense current is applied successively in opposite directions, and chosen to be of sufficient magnitude to switch the free layer to either of the two possible circumferential magnetization direction states, which would result in either relatively high or low cell resistances. In this manner these sense currents would set voltages across the cell which could be used to determine the resistance, and hence the memory state stored in the cell.

In FIG. 5, a ring structure is shown for this alternative data storage arrangement in which the tunnel junction must have a low enough resistance-area product and sufficient thermal resistance to the substrate on which it is provided to result in heating at the maximum storage current through the junction that is sufficient for the cell to reach the Néel temperature of the antiferromagnet. A simpler version of this cell would be to use a stiffer (higher magnetic field needed for switching) magnetic material to form a layer substituting for both pinned layer 14'' and pinning layer 14', and a softer layer for unpinned, or free, layer 12', the softer layer once again being used to determine the state of the cell. Another variation for this kind of cell is to use a conducting post through the hole at the center of the ring (but insulated from the surrounding ring layers) for carrying the storage current and generating the needed heat, and a separate contact to the tunneling barrier ring for carrying the sensing current to read the stored information. This last described device has to have three contacts making fabrication more difficult. However, the device would have a high signal from the magnetic tunnel junction formed by the ring and potentially would require a low current for storing data.

Figure 6:
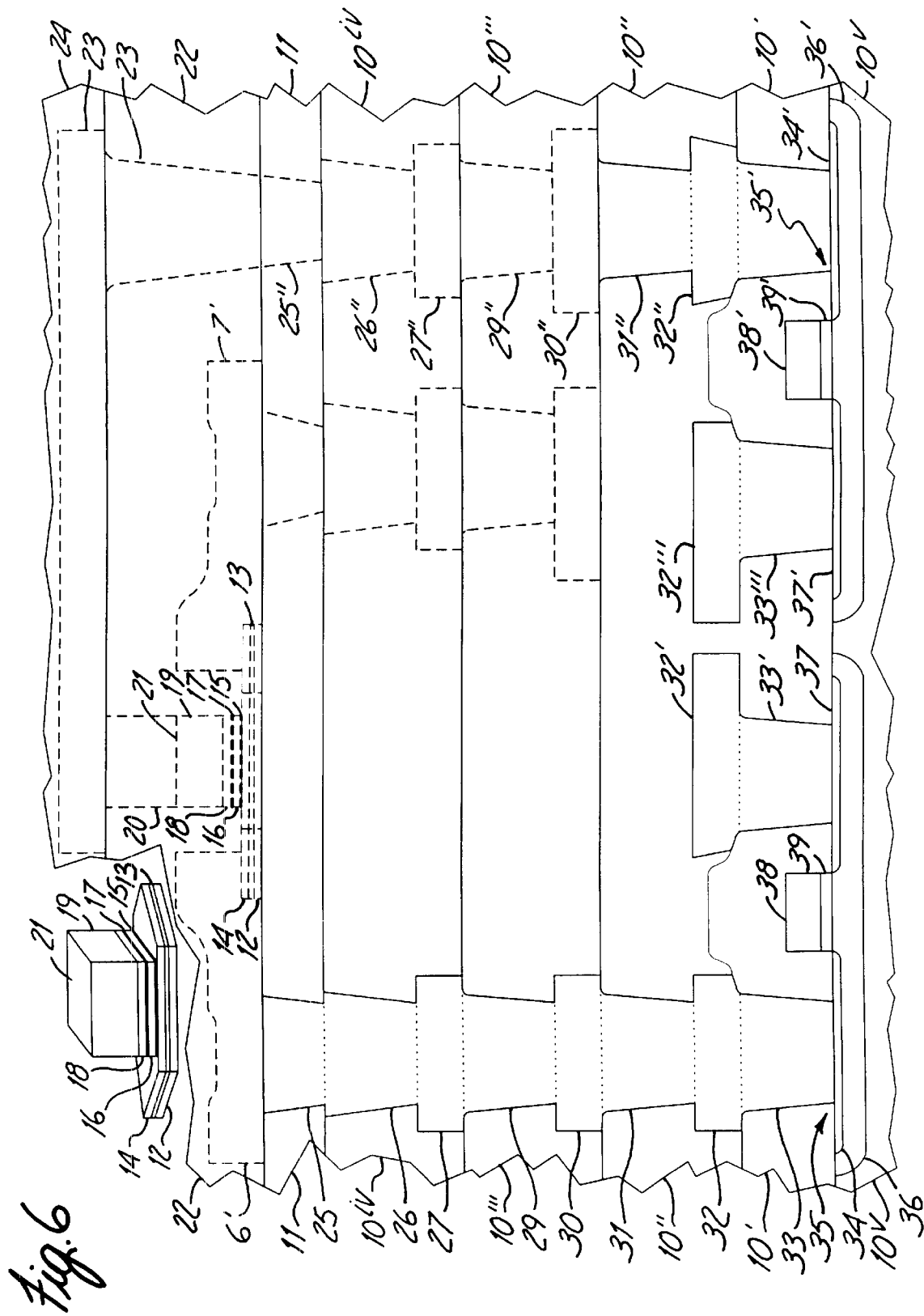

A memory cell 1 well suited for the memory cell switch based selection schemes of FIGS. 2 and 3 uses a barrier junction to produce a large sense signal for high speed data access with a relatively small sense current and substitutes a "giant magnetoresistive effect" device "sandwich" structure for a single free ferromagnetic layer to reduce demagnetization fields, and so data storage currents, is shown in the layer diagram of FIG. 6. The substantially reduced storage currents needed means that this memory cell can be reduced in size to have widths much smaller than 1.0 $\mu$m without requiring incompatibly large current carrying conductors and selection transistors to be used therewith. Here, too, a perspective view of just the cell structure of cell 1 is shown in the upper left hand corner of the figure, and the layer diagram gives an indication of the structural layers, but is not a true cross section view in that many dimensions there are exaggerated or reduced relative to one another for purposes of clarity as in FIGS. 4 and 5.

Such a magnetoresistive memory cell device in its basic form has for its bottom three layers two ferromagnetic thin-films (typically permalloy layers) with a nonmagnetic layer between them in a first "sandwich" construction. The two thin-film layer edges parallel to the major extent, or length, of the device, and the direction of storage current flow current flow, are perpendicular to the easy axes of those layers and would preferably be magnetically hard in order to avoid trapped domain walls after the cell has a series of magnetic states set therein to represent stored data as a result of arbitrary stored data sequences. Completing this device, the upper ferromagnetic layer of these just described bottom three layers serves also as part of a pinned layer magnetic tunnel junction second "sandwich" structure (or spin dependent tunnel structure) through having a barrier layer thereon which in turn supports a cobalt iron (CoFe) ferromagnetic layer having its magnetization direction pinned by an antiferromagnetic layer in turn on it.

The cell has data, or a magnetic state, stored therein by passing a relatively high current through the lower three layer first sandwich structure, which provides a magnetic field in opposite directions in the two ferromagnetic layers of that structure. The direction of the current is used to store either a magnetic state therein representing a binary "1" or an alternative magnetic state representing a binary "0". The two magnetic states are determined by either the upper one of the lower two ferromagnetic layers in the first sandwich structure being magnetized along the device width (and easy axis thereof) toward one of the device long sides with the bottom one of these two ferromagnetic layers being magnetized to the opposite side for one state, or vice versa for the alternative second magnetic state. Retrieving the stored data, i.e. determining which magnetic state the device is in, is accomplished by establishing a tunneling current through the barrier junction provided between the pinned cobalt iron layer in the second "sandwich" structure and the upper ferromagnetic layer in the first "sandwich" structure that is also in the second "sandwich" structure.

The pinned cobalt iron layer in the second "sandwich" structure is connected to a first transistor to at least in part control the tunneling current used for data retrieval, and a second transistor is connected to the nonmagnetic layer in the first sandwich structure to control the storage current to form the basic memory cell in addition to controlling in part the tunneling current in some retrieval schemes. This device can be selected for having a storage current established therein in an array of cells provided in a manner in either of FIG. 2 or 3 with this second transistor being the selection transistor. Retrieving data stored in the device by determining its magnetic state requires that the resulting voltage occurring across the barrier junction following the establishment of a fixed tunneling current through the first transistor (both transistors in some schemes) be compared to a reference to determine the state of the magnetizations of the two ferromagnetic layers on either side of the nonmagnetic layer in the first "sandwich" structure. One desirable reference would be based on providing a threshold voltage half-way between a device output voltage representing a binary "0" and a device output voltage representing a binary "1" so that the difference between the output signal and the reference is either a plus or negative voltage, and so permit a simple comparator to be used to detect the memory cell magnetic state.

The tunneling barrier in FIG. 6 can be aluminum oxide. Although aluminum or copper can be used as the material for the nonmagnetic layer in the first "sandwich" structure, a poorer conductor can be used instead, or even an insulator could be used to have the first "sandwich" structure also be a spin dependent tunneling structure. Better conductors for the nonmagnetic layer give stronger effective fields that are applied to the ferromagnetic layers in the first "sandwich" structure. A coupling field could occur between the pinned cobalt iron layer in the second "sandwich" structure and the upper ferromagnetic layer of the first "sandwich" structure (and the second "sandwich" structure), and so surface roughness at the interfaces between layers should be minimized to reduce the possibility or magnitude of any such coupling.

In addition, while a single pinned cobalt iron layer has been described, that arrangement would result in the stray fields of an "open flux" structure which could prevent operation at small device geometries needed to achieve a high areal density array. A pinned synthetic antiferromagnet formed of layers of an antiferromagnetic layer provided on a three layer arrangement having tow layers of cobalt iron separated by a layer of ruthenium instead of the single cobalt iron layer, in which the two cobalt iron layers are of approximately equal thicknesses and are strongly antiparallel-coupled would eliminate any such stray field problem.

The spin dependent tunneling-giant magnetoresistive effect memory cell device, or integrated GMR tunneling device memory cell, actually shown in FIG. 6 has the controlled current paths immediately connected thereto also shown. This memory cell structure is provided on a semiconductor material monolithic integrated circuit chip serving as a substrate therefor and having electronic circuit component devices provided in the semiconductor material thereof as the substrate for the remaining portions of the integrated circuit itself. Those remaining portions of the monolithic integrated circuit are a series of four electrical insulating layers, 10', 10", 10''', 10$^{iv}$, each typically formed of silicon dioxide, provided on the indicated semiconductor material, 10$^v$. Each of the lower three of these electrical insulating layers have a metal circuit interconnection pattern supported thereon for electrically interconnecting selected ones of the circuit component devices therebelow in semiconductor material 10$^v$ and the integrated "sandwiches" tunneling devices provided thereabove.

Following chemical and mechanical polishing of the surface of last or uppermost electrical insulating layer 10$^{iv}$, and the opening of vias therein to provide metal interconnections to the interconnection layer therebelow, a further electrical insulating layer, 11, is formed on the resulting surface by sputter deposition and silicon nitride to a thickness of typically 1000 Å. The surface of layer 11 is then also chemically and mechanically polished to provide a resulting surface on which the integrated "sandwich" tunneling device is to be provided.

This integrated "sandwich" tunneling device is next provided by a series of layer depositions with portions of these deposited layers being later removed by ion milling to leave the desired device portions remaining on the upper surface of layer 11. The remaining portions will be designated with the same numerical designation as are used in describing the deposition layers from which each is formed and shown in dashed line form in FIG. 6 because of being positioned rearward from the plane of the figure. Thus, first ferromagnetic thin-film layer 12 is deposited of an alloy comprising 65% nickel, 15% iron and 20% cobalt deposited to a thickness of 40 Å. This layer is deposited in an easy axis orienting magnetic field directed from front to back, or back to front, in FIG. 6 across the width of the finally formed devices to induce the easy axis in this layer to lie perpendicular to the plane of the figure.

Thereafter, electrically conductive, but nonmagnetic, thin-film substitute "sandwich" intermediate layer 13 of Ruthenium (Ru) is deposited to a thickness of 50 Å. Ruthenium is chosen for this substitute "sandwich" intermediate layer to yield a smoother resulting exposed surface after its deposition, but copper or tantalum could alternatively be used.

This intermediate layer is followed by providing further ferromagnetic thin-film layer 14 again an alloy of 65% nickel, 15% iron and 20% cobalt deposited to a thickness of 40 Å. Layer 14 is again deposited in an easy axis orienting magnetic field to induce the easy axis in this layer to also lie perpendicular to the plane of the figure. Layers 12, 13 and 14 together form the basis for a "sandwich" structure, which may be a giant magnetoresistive effect device, having two ferromagnetic thin-film layers therein, and layer 14 will also be directly part of the spin dependent tunneling device next to be next completed through providing the remainder thereof as described below.

Next, a spin dependent tunneling, or SDT, intermediate layer, or barrier layer, 15, is provided by sputter deposition onto layer 14, this barrier layer being a dielectric and represented as a dashed, bold solid line in FIG. 6. Layer 15 is provided typically by sputter depositing 12 Å of aluminum onto layer 14, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving a barrier layer thickness of approximately 17.5 Å with this layer being formed primarily of aluminum oxide.

The provision of barrier layer 15 is followed by providing a compound ferromagnetic thin-film and conductive thin-film layer combination together on layer 15 as a pinned synthetic antiferromagnet. This compound thin-film layer is provided to have a net layer magnetization that, when fixed in a selected spatial orientation in the finally formed structure, will resist magnetization rotation, and certainly resist firmly any magnetization rotation therein that could be sufficient to lead to a reversal in its orientation as a result of expected externally applied magnetic fields. Thus, for the finally formed cell structures intended to be used in limited magnetic fields, the magnetization of this compound thin-film layer will appear fixed in its orientation in the device, i.e. "pinned" in a direction relative to the finally formed cell structure which will again be perpendicular to the plane of FIG. 6.

This compound thin-layer film is formed by first sputter depositing a ferromagnetic thin-film layer, 16. Layer 16 is of cobalt iron comprising 95% cobalt and 5% iron to a thickness of 50 Å which layer is deposited in the presence of an easy axis direction determination magnetic field that is aligned with the easy axis direction of the ferromagnetic layers 12 and 14 therebelow. Then a nonmagnetic layer, 17, of Ruthenium is sputter deposited to provide a Ru antiferromagnetic coupling layer of 9 Å thickness shown as a dark dashed line in FIG. 6. Thereafter, another ferromagnetic layer, 18, of cobalt iron comprising 95% cobalt and 5% iron is deposited to a thickness of 50 Å, and deposited again in the presence of an easy axis direction determination magnetic field aligned as was the field for layer 16. The resulting compound layer of layers 16, 17, 18 has materials with high spin polarization in its outer layers due to the use of high magnetic induction cobalt iron therein, but has little total magnetic moment because of the Ru layer provided therebetween which strongly antiferromagnetically couples these outer layer through primarily exchange coupling so that the magnetizations of each are pointed in opposite directions. Thus, this layer is relatively insensitive to externally applied magnetic fields and contributes little to the spatial magnetic fields thereabout. However, the magnetization direction in this composite layer by itself is not very strongly fixed in any direction because of the relatively weak anisotropy exhibited by the CoFe layers.

Thus, a further antiferromagnetic material "pinning" layer exhibiting a substantial magnetic anisotropy must be deposited on layer 18 to strongly set the magnetization direction of compound layer 16, 17, 18 in the direction of the easy axis in layers 12 and 14. Such a layer has a strongly fixed magnetization direction which, through exchange coupling to layer 18, strongly fixes the direction of magnetization of that layer also, and so that of layer 16 through Ru layer 17. The result is an antiferromagnetic layer coupled strongly to compound layer 16, 17, 18 which also provides a high magnetic inductance material layer, layer 16, with a corresponding substantial spin polarization against barrier layer 15. Hence, a CrPtMn pinning layer, 19, of 45% chromium, 10% platinum and 45% manganese is sputter deposited on layer 18 to a thickness of 300 Å in the presence of a magnetization axis determination magnetic field aligned with the field used in forming cobalt iron layers 16 and 18.

Upon completion of this antiferromagnetic magnetization pinning arrangement shown in FIG. 6 using these magnetization direction determination layers, a 1000 Å layer of aluminum is sputter deposited on pinning layer 19. The resulting layer, 20, after final formation thereof protects what is below, and allows electrical connections thereto for circuit purposes.

Next in this fabrication process, a further layer is deposited on layer 20 to provide an etching termination layer, or stop, for subsequent etching steps. A milling mask layer is then sputter deposited on the etch stop layer to there be prepared for use as a milling mask by being suitably patterned using standard techniques. This last masking pattern is to result, after milling therethrough to remove the exposed ferromagnetic, antiferromagnetic and nonmagnetic layers therebelow, in providing the pinned electrode structures in the memory cell spin dependent tunneling structures which are formed in a "sandwich" construction with barrier layer 15 and ferromagnetic thin-film layer 14. This subsequent ion milling step removes the exposed portions of aluminum layer 20, the next exposed portions of pinning layer 19, and then the next exposed portions of the compound layer 16, 17 and 18 down to barrier layer 15 to thereby form the structures of such pinned electrodes in each memory cell.

A second material removal step is then performed to form the barrier and substitute "sandwich" device for each memory cell. Following standard patterning arrangements, ion milling is used to form the substitute "sandwich" structure devices for the memory cells with the corresponding barrier layer thereover in the form of central rectangular solids with a pair of triangular solids ends on either side thereof along the lengths as shown in FIG. 6. The pinned electrodes formed above are each positioned on and over just the corresponding central rectangular solid in each memory cell as shown in FIG. 6. A milling mask layer is deposited and patterned in such a way as to form a pattern for an etching mask which is to be formed following that pattern by leaving the desired masking portions of that layer. The unwanted portions of the masking layer are removed down to barrier layer 15 serving as an etch stop.

This last masking pattern is to result, after milling therethrough to remove the exposed barrier layer, ferromagnetic layers and substitute "sandwich" intermediate layer, in providing a substantial number of substitute "sandwich" device structures to serve as portions of the corresponding memory cells with each such substitute "sandwich" device being in a "sandwich" construction having ferromagnetic layers 12 and 14 on either side of substitute "sandwich" intermediate layer 13, and with barrier layer 15 and the corresponding pinned electrode thereon. The remaining portions of the masking layer serve as the above mentioned milling mask for the subsequent ion milling step which removes the exposed portions of barrier layer 15, and thereafter, also the next exposed portions of ferromagnetic thin-film layer 14, and the then exposed portions of conductive substitute "sandwich" intermediate layer 13, and finally the then exposed portions of ferromagnetic thin-film layer 12 down to insulating layer 11 to thereby form the structure of the substitute "sandwich" device and complete the structure of the memory cell, 21, as shown in FIG. 6.

Following the completion of memory cell structures 21, openings are made using standard steps through silicon nitride layer 11 to reach appropriate metal interconnection risers extending through other insulating layers in the monolithic integrated circuit therebelow, and a 1000 Å layer of aluminum alloyed with 2% copper is sputter deposited on triangular ends of the substitute "sandwich" structures portions of memory cell structures 21 having ferromagnetic layers 12 and 14 with nonmagnetic layer 13 therebetween, and on the exposed portions of layer 11 and the interconnection conductors in exposed in the openings therein. After the patterning of this layer using standard methods, the resulting electrical interconnections, 6' and 7', to a memory cell structure 21 provide for circuit interconnection of that memory cell structure.

Thereafter, a layer of silicon nitride is sputter deposited over those structures and the exposed portions of insulating layer 11 to a thickness of 1000 Å to form another insulating layer. Photoresist is provided over this insulating layer as an etching mask to provide via openings therethrough in a following etching step to form a completed insulating layer, 22, and then through silicon nitride layer 11 to reach appropriate metal interconnection risers extending through other insulating layers in the monolithic integrated circuit therebelow.

On insulating layer 22, so prepared, a further metal deposition is made again of aluminum alloyed with 2% copper to cover that layer and fill the via openings therein, and in silicon nitride layer 11. This metal layer is deposited to a thickness of 2000 Å typically and patterned in a standard manner to eliminate the unwanted metal layer portions. The structures that result from this elimination are shown in FIG. 6 as interconnection, 23, for interconnecting the pinned layers in the tunnel junction structure portion of memory cell structure 21 to the electronic circuitry in the integrated circuit therebelow through mating with metal interconnection risers extending through insulating layers of that integrated circuit. A further protective electrical insulating layer, 24, of silicon nitride is deposited to cover and protect interconnections 23.

Interconnection 6' extending from memory cell 21 in FIG. 6 meets an electrical interconnection riser on the left in that figure by having a portion thereof, 25, extend through silicon nitride layer 11 to reach a plug, 26, of tungsten and be in electrical contact therewith at the upper end of that riser. Plug 26 in turn extends through integrated circuit insulating layer 10" to reach and be in electrical contact with a portion, 27, of the third metal layer of that integrated circuit formed of primarily aluminum.

Third metal layer interconnection portion 27 is in contact with a further tungsten plug, 29, extending through electrical insulating layer 10''' to reach a portion, 30, of the aluminum second metal layer in the integrated circuit. Second metal layer portion 30 is in contact with a further tungsten plug, 31, which extends through electrical insulating layer 10'' of the integrated circuit to a portion, 32, of the aluminum first metal layer of the integrated circuit.

First metal layer portion 32 is in contact with a final tungsten plug, 33, extending through electrical insulating layer 10' of the integrated circuit to reach semiconductor material 10$^v$ of that integrated circuit, specifically, to be electrically connected to one of the terminating regions, 34, of a metal-oxide-semiconductor field-effect transistor (MOSFET), 35. Terminating region 34 of transistor 35 is formed of an n$^+$-type conductivity material formed in a p-type conductivity material tub, 36, in n-type conductivity semiconductor material 10$^v$. Transistor 35 has a further n$^+$-type conductivity material terminating region, 37, formed in p-type conductivity material tub 36. In addition, transistor 35 has an n$^+$-type conductivity polysilicon gate, 38, between terminating regions 34 and 37 separated from tub 36 by a thin gate oxide, 39.

Terminating region 37 has a tungsten plug, 33', extending through electrical insulating layer 10' of the integrated circuit to reach another portion, 32', of the first metal layer of the integrated circuit. In a typical arrangement, first metal layer portion 32' extends to other switching transistors as in one of the memory cell switch based selection schemes of FIGS. 2 and 3 which in turn are connected between pads suited for connection to positive and negative sources of voltage, or between a positive source of voltage and a ground reference voltage as shown there, that permit selecting the current flow direction through this transistor and the memory cell structure 21 connected thereto. In this situation, terminating region 37 serves alternatively as a drain and a source for transistor 35. In either situation, memory cell structure 21 will have current provided therethrough controlled by transistor 35, and by other switching transistors not shown in this figure.

Interconnection 7' extending from memory cell 21 in FIG. 6 is positioned on an electrical interconnection riser just to the right of center in FIG. 6 by being in electrical contact with a first plug, 25', of aluminum at the upper end of that riser. Plug 25' extends through silicon nitride layer 11 to reach a second plug, 26', of tungsten which in turn extends through integrated circuit insulating layer 110 to reach and be in electrical contact with another portion, 27', of the aluminum third metal layer of that integrated circuit.

Third metal layer interconnection portion 27' in FIG. 6 is in contact with a further tungsten plug, 29', extending through electrical insulating layer 10''' to reach another portion, 30', of the aluminum second metal layer in the integrated circuit. Second metal layer portion 30' extends to a ground reference voltage, or to other switching transistors as in one of the memory cell switch based selection schemes of FIGS. 2 and 3 which in turn are connected between pads suited for connection to a positive source of voltage and to a ground reference voltage.

Interconnection 23 extending from memory cell 21 on the right in FIG. 6, and through insulating layer 22, meets an electrical interconnection riser on the right in that figure by having a portion thereof, 25'', extend through silicon nitride layer 11 to reach a plug, 26'', of tungsten and be in electrical contact therewith at the upper end of that riser. Plug 26'' in turn extends through integrated circuit insulating layer $10^{iv}$ to reach and be in electrical contact with a portion, 27'', of the aluminum third metal layer of that integrated circuit.

Third metal layer interconnection portion 27'' is in contact with a further tungsten plug, 29'', extending through electrical insulating layer 10''' to reach a portion, 30'', of the aluminum second metal layer in the integrated circuit. Second metal layer portion 30'' is in contact with a further tungsten plug, 31'', which extends through electrical insulating layer 10'' of the integrated circuit to another portion, 32'', of the aluminum first metal layer of the integrated circuit.

First metal layer portion 32'' is in contact with a final tungsten plug, 33'', extending through electrical insulating layer 10' of the integrated circuit to reach semiconductor material 101 of that integrated circuit, specifically, to be electrically connected to one of the terminating regions, 34', of another MOSFET, 35'. Terminating region 34' of transistor 35' is formed of an n$^+$-type conductivity material formed in a p-type conductivity material tub, 36', in n-type conductivity semiconductor material 10$^v$. Transistor 35' has a further n$^+$-type conductivity material terminating region, 37', formed in p-type conductivity material tub 36'. In addition, transistor 35' has an n$^+$-type conductivity polysilicon gate, 38', between terminating regions 34' and 37' separated from tub 36' by a thin gate oxide, 39'.

Terminating region 37' has a tungsten plug, 33''', extending through electrical insulating layer 10' of the integrated circuit to reach another portion, 32''', of the first metal layer of the integrated circuit. In a typical arrangement, first metal layer portion 32''' extends to a pad suited for connection to other switching transistors not shown used in a data retrieval selection scheme. In this situation, terminating region 37' may serve as either a drain or a source for transistor 35'.

The magnetization state switching threshold for the substitute "sandwich" device structure portion of a corresponding memory cell structure 21 can be approximately found from using one or another of mathematical models for that structure assuming here that the transistor switching thresholds and sufficiently uniform and the memory cell output signal is large enough so that a single memory cell is adequate to store a binary bit of information which can be selectively stored by use of one of the memory cell switch based selection circuit arrangements of FIGS. 2 and 3 for the structural arrangement shown in FIG. 6. The substitute "sandwich" device structure portion is shown in representational form in FIG. 7 with just the two ferromagnetic layers being present (the nonmagnetic intermediate layer is not shown) to show the coordinate system with the relatively long dimension of the structure being along the Cartesian coordinate y and the relatively short width of the structure (and the layer easy axes) being along the Cartesian coordinate x axis. The magnetization vectors for each of layers 1 and 2 are shown by arrows positioned at angles with respect to the layer easy axes, i.e. the x coordinate axes.

An approximation to determine the magnetic field threshold and related operating currents to switch between the magnetic states of this structure, which is assumed to be small enough to have single domain ferromagnetic layers, can be obtained from minimizing the structure free energy thereof which is equivalent to setting the magnetic torques, $T_{q1}$ (layer closest to barrier junction) and $T_{q2}$ (layer further from barrier junction), on the substitute "sandwich" structure ferromagnetic layers each to zero where each such layer has a magnetic saturation $M_s$, or $$0 = T_{q1} = -M_s H_{k1} \sin\theta_1 \cos\theta_1 + M_s H_s S_{f1} \sin\theta_1 - M_s H_{cp} \sin\theta_1 + M_s H_{demagx1} \sin\theta_1 + M_s H_w \cos\theta_1 - M_s H_{demagy1} \cos\theta_1 + M_s H_b \sin\theta_1,$$

and $$0 = T_{q2} = -M_s H_{k2} \sin\theta_2 \cos\theta_2 + M_s H_s S_{f2} \sin\theta_2 + M_s H_{demagx2} \sin\theta_2 + M_s H_w \cos\theta_2 - M_s H_{demagy2} \cos\theta_2 - M_s H_b \sin\theta_2.$$

In these equations, $H_{demagx1}$ and $H_{demagx2}$ are the effective demagnetizing fields across the widths of the corresponding ones of the cell substitute "sandwich" structure layers with $H_{demagx1} = H_{dx1} \cos\theta_1 - H_{dx2} \cos\theta_2$ and with $H_{demagx2} = H_{dx2} \cos\theta_2 - H_{dx1} \cos\theta_1$ where $H_{dx1} = 4\pi MT_1/(T_1+W)$ and $H_{dx2} = 4\pi MT_2/(T_2+W)$ are the maximum demagnetizing fields across the widths of the corresponding ones of the cell substitute "sandwich" structure layers which are identical for $T_1 = T_2$, and $H_{demagy1}$ and $H_{demagy2}$ are the effective demagnetizing fields across the lengths of the corresponding ones of the cell GMR effect device layers with $H_{demagy1} = H_{demagy2} = Hd_{y1} \sin\theta_1 + Hd_{y2} \sin\theta_2$ where $Hd_{y1} = RH_{dx1}$ and $Hd_{y2} = RH_{dx2}$ are the maximum demagnetizing fields across the lengths of the corresponding ones of the cell substitute "sandwich" structure layers and R is the ratio of the demagnetization field along either layer to that across that layer as determined by the cell substitute "sandwich" structure shape;

$H_{k1,2}$ are the effective anisotropy fields in the corresponding ones of the cell substitute "sandwich" structure layers;

$H_s$ is the maximum value of the sense field (at outer edges, i.e. the layer outer major surfaces of the cell substitute "sandwich" structure layers thereby resulting in one major surface from each layer being referenced) provided by a sense current through the cell, including through the substitute "sandwich" structure, parallel to the cell barrier;

$S_{n,2}$ is the fraction of the maximum sense field that characterizes the average sense field through the thickness of a corresponding one of the cell substitute "sandwich" structure layers calculated from the layer conductivity;

$H_w$ is a possible externally applied magnetic field applied from a current conductor along the cell length if provided at all;

$H_{cp}$ is the effective coupling field arising from facing ferromagnetic layers uneven surface textures, or "orange peel" effect, with the coupling being from the cell substitute "sandwich" structure layer further from the junction to the layer closer thereto;

$H_b$ is a possible externally applied bias magnetic field applied from a current conductor along the cell width if provided at all; and $\theta_{1,2}$ are angles of corresponding ones of the cell substitute "sandwich" structure layer magnetizations away from the easy axes that are across the widths of those layers and antiparallel to one another absent applied magnetic fields.

The switching threshold can be found numerically by increasing the operating magnetic fields $H_s$ and $H_w$ in small increments until the magnetization of the free layer switches to the opposite direction, and from the values of these fields at that point the currents to provide them can be determined. These threshold currents will be significantly less than those for the memory cell devices of FIGS. 4 and 5 because the maximum demagnetization fields for the cell substitute "sandwich" structure layers in place of the single free layer in the cell junction device will be so much less due to the flux path closure provided by the cell substitute "sandwich" structure layers, these two equally thick ferromagnetic layers about the nonmagnetic intermediate layer of thickness g having a joint demagnetization field of approximately $16\pi MTg/W^2$ where T is ferromagnetic layer thicknesses and W is the width of those layers.

An analytic approximation to determine the magnetic field threshold and related operating currents to switch between the magnetic states of the substitute "sandwich" device structure portion of a corresponding memory cell structure 21 as represented in FIG. 7, again assumed to be small enough to have single domain ferromagnetic layers, can be obtained from Stoner-Wohlfarth threshold theory. The switching threshold can from this theory be represented in parametric form as the critical angle, $\theta_c$, past which rotation of the layer magnetization leads to a switching of that magnetization to be in the opposite direction along the easy axis absent externally applied magnetic fields. That critical angle is known from the theory to occur at the following field ratios $H_s/H_k = \cos^3 \theta_c,$ and $H_w/H_{k} = \sin^3 \theta_c.$ If the same current value is used to provide both the word and sense magnetic fields, then these fields are equal to one another so that $\cos^3 \theta_c = \sin^3 \theta_c$ leading to $\theta_c = \pi/4$, and giving $\cos^3 \pi/4 = \sin^3 \pi/4 = 0.354$. If the anisotropy field $H_k$ has a typical value of 15 Oe, then $H_s = H_w = 5.31$ Oe in these circumstances.

The field due to a current I in the FIG. 7 structure is approximately $H_s = (4\pi/10)(I/2)(1/W)$ where only half the current is effective in providing the sense field in each of the ferromagnetic layers. This field is determined from the line integral of the total magnetic field about the current flow through the FIG. 7 structure, i.e. primarily across the width of the sensor in view of the thinness of the ferromagnetic layers. If the operating fields each have a 50% margin over the field value necessary to reach the critical angle as found above and the average sense field across each ferromagnetic layer is 75% of the maximum sense field provided, this last equation and the critical sense field value found above leads to the following equation for the sense current (and so the word line current) for 1.0 μm wide ferromagnetic layers $(5.31)(1.5) = (0.75)(1.256)(I/2)(1/10^{-4})$ giving a sense current of 1.69 mA which is easily managed in the structure arrangement shown in FIG. 6.

A micromagnetic model in differential equation form can alternatively be used as model for the substitute "sandwich" device structure portion of a corresponding memory cell structure 21 as represented in FIG. 7 in which the two ferromagnetic layers are assumed to have magnetization rotations which rotate with equal angular change in opposite directions so that the demagnetization field across the cell layers can be represented in closed form. The model chosen includes the effects of magnetization edge curling, which were not represented in the earlier models, but with the magnetizations at the very outside edges assumed pinned in a fixed direction along the corresponding edge. The differential equation for this model is $$0 = -M_s H_K \sin\theta\cos\theta + M_s H_s \sin\theta + M_s H_w \cos\theta + M_s^2 2\pi S_p T \frac{d^2(\cos\theta)}{dx^2}\sin\theta + 2A\frac{d^2(\theta)}{dx^2}$$

where A is the exchange constant and $S_p$ is the effective gap between the ferromagnetic layers equal to actual gap plus one fourth the thickness of a ferromagnetic layer. This effective gap, or the effective separation, is somewhat greater than the actual physical separation of those layers, i.e. the thickness of the intermediate layer, because of the turning of the magnetic fields in one ferromagnetic layer toward the other at the long edges of these layers so as to have to pass through the gap to the other. The first on the right is the anisotropy torque, the second term is the sense field torque, the third term is the word line field torque and includes y direction demagnetization, and the fourth term represents the x direction demagnetization. The final fifth term is the exchange torque.

Solving this equation numerically in view of the nonlinearities therein shows that a 1.0 μm wide cell is adequately stable in maintaining the layer magnetizations along the layer easy axes in the direction they were last oriented through setting a magnetization state in the structure with a storage current for an anisotropy field of 15 Oe or more in the ferromagnetic layers. Narrower cells, however, require a higher anisotropy field in the ferromagnetic layers to be stable. The anisotropy fields of the magnetic layers can be increased by structural changes such as adding more ferromagnetic layers to the structure or by material changes in the ferromagnetic layers. Output signal values obtained in retrieving the stored magnetic state in a cell to thereby obtain stored data from that cell are shown to be significantly reduced by the edge curling present in the ferromagnetic layers.

If more than one FIG. 6 element is used in forming a memory cell, then the output signal values obtained in retrievings of the stored magnetic state in a cell can be larger, and thus the data retrieval rate from such cells can be increased because the bandwidth of the sense amplifiers can be increased in the presence of a larger signal-to-noise ratio per bit. FIGS. 8A and 8B show perspective views of pairs of FIG. 6 cell structures 21 and some interconnections thereof in various forms removed for clarity from the integrated circuit structure arrangement of FIG. 6 that provide two alternative arrangements in which this may be accomplished. FIG. 8A shows use of a parallel connection of two cell structures 21 using a structure interconnection arrangement, 40, to carry the storage current represented as being supplied by a storage current source, 41, connected to interconnection arrangement 40. FIG. 8B shows use of a series connection of two cell structures 21 using a structure interconnection arrangement, 42, to carry the storage current represented as being supplied by a storage current source, 43, connected to interconnection arrangement 42.

In both arrangements, the retrieval output signal voltages occurring across the barrier junctions of the two cell structures 21 used in the cell because of the retrieval currents provided therethrough, represented as being provided by a pair of retrieval current sources, 44 and 45, connected to the pinning layer of structures 21 in FIG. 8A and a pair of retrieval current sources, 46 and 47, connected to the pinning layer of structures 21 in FIG. 8B, are of opposite polarities with respect to one another. This is because of the storing always of opposite magnetization states in these two structures as a result of the paths the storage currents are forced to follow in each. Thus, a differential sensing arrangement is used in each arrangement as represented by the connection of the inputs of a differential amplifier, 48, to retrieval current sources 44 and 45 in FIG. 8A and as represented by the connection of the inputs of a differential amplifier, 49, to retrieval current sources 46 and 47 in FIG. 8B. This differential sensing arrangement gives a large output signal value at the differential amplifier outputs about the amplifier voltage reference value without the need for a further external reference.

As previously indicated, the storage currents used in setting the magnetic states of cell structures 21 in FIG. 6 must be kept as small as possible so as to minimize the size of the selection transistor required to control those currents. Two structural enhancements to reduce those currents from the 2 to 4 mA which are ordinarily used in magnetic sandwiches (500 $\mu$A would be a desirable goal) are illustrated in FIGS. 9A and 9B. These figures each show smaller portions of the layer diagram of FIG. 6 but including the corresponding enhancement and a top view of just the corresponding cell structure 21 in the upper left hand corner. As in FIG. 6, both FIGS. 9A and 9B include extending the lower substitute "sandwich" structure, or lower three layers of the FIG. 6 cell structure 21 past the barrier layer and the pinned and pinning layers of that element into ends that are tapered to a point so that those ends appear triangular, a configuration for the lower "sandwich" structure which has been found favorable for magnetic stability (those triangular ends are shown in the corresponding layer diagram covered in whole or part by interconnection portions for carrying the storage current by conducting it in or out of the cell structure as selected). Magnetically hard edges of the permalloy ferromagnetic layers in the substitute "sandwich" structures are assumed so that, at the edges of these films, the magnetizations will lie essentially parallel to such edges. The easy axes of these magnetic films lie along the structures widths, and in the centers thereof the magnetizations will be directed along these easy axes in the absence of an externally applied magnetic field. The memory cell spin dependent tunneling structure which is formed in the second "sandwich" structure with barrier layer 15 and ferromagnetic thin-film ferromagnetic layer 14 shown in FIG. 6 on top of the substitute "sandwich" structure has no significant role in the switchings of the magnetic states of the substitute "sandwich" structure involved in the data storage process.

The first structural enhancement for reducing storage currents shown in FIG. 9A is to provide a current strap, 50, over the spin dependent tunneling structure which is formed in the second "sandwich" structure with barrier layer 15 and ferromagnetic thin-film ferromagnetic layer 14 as a part of cell structure 21. Current strap 50 serves as a conductor for a current used to provide a magnetic bias field directed along the length of that structure. The effect of such a bias field on the switching threshold was specifically provided for in the first set of cell structure 21 modeling equations set out above, and serves to provide an aiding field to reduce the storage current needed to otherwise generate the necessary operating field to switch the magnetic state of the cell structure. If the magnetizations of the permalloy ferromagnetic magnetic layers edges are pinned to follow those edges because of being magnetically hardened, then the magnetic bias field will primarily be directed along the direction of edge magnetization pinning. In addition, a ferromagnetic "keeper" layer, 51, is provided over current strap 50 along the length of cell structure 21 to confine the magnetic field due to the current in strap 50 to the vicinity of cell structure 21 and to enhance magnetic fields directed theralong. Another electrical insulating protective layer, 53, of silicon nitride is provided strap 50 and layer 51.

The biasing current for current strap 50 can be taken from the voltage supply bus in common with current being supplied to the memory cell, and is carried in strap 50 in the same direction regardless of the direction followed by the storage current on any particular data storage occasion because of the switching of the circuitry operating the cell structures. This reduction in the magnitude of the storage current required for switching the magnetization directions of the permalloy magnetic layers in the modified FIG. 6 cell in this configuration is simply due to the well-known Stoner-Wohlfarth-like switching threshold of magnetic films, where a field at right angles to the ferromagnetic layers easy axis direction tips the layers magnetization, and thus reduces the remaining field required in the easy axis direction to switch the magnetization to the opposite easy axis direction.

The second alternative structural enhancement to reduce storage currents used is made directly to cell structure 21 of FIG. 6 as shown in FIG. 9B, and involves tapering the end of that structure more gradually on the side through which only storage currents selectively occur (the side of the element in FIG. 6 on which the transistors are not connected) in forming its triangular shape and covering only a part of this tapered end with interconnection 7' so that current flows in the cell in the remaining uncovered part of the tapered end. The relatively sharp taper on the other side of the cell structure shown essentially fully covered by interconnection 6' where the retrieval currents also exit is retained as before. At the gradual tapered end, the magnetically stable region in the center of the substitute "sandwich" structure, where the magnetization follows the easy axis across the width, narrows because of the narrowing of the structure end due to the taper, and the magnetization there is thus more susceptible to reversal. A relatively small magnetic field provided by a relatively small storage current through the cell can still nucleate a reverse domain at the narrowest portion of the taper just outside the interconnection, which will then propagate along the tapered end to the wide part of the cell structure where the barrier junction is located. In addition, the magnetic field generated per unit of storage current is higher in the tapered end region because the resulting magnetic field is inversely proportional to the line width due to current path spreading reducing the current density, and so even less current is required.

Figure 10:
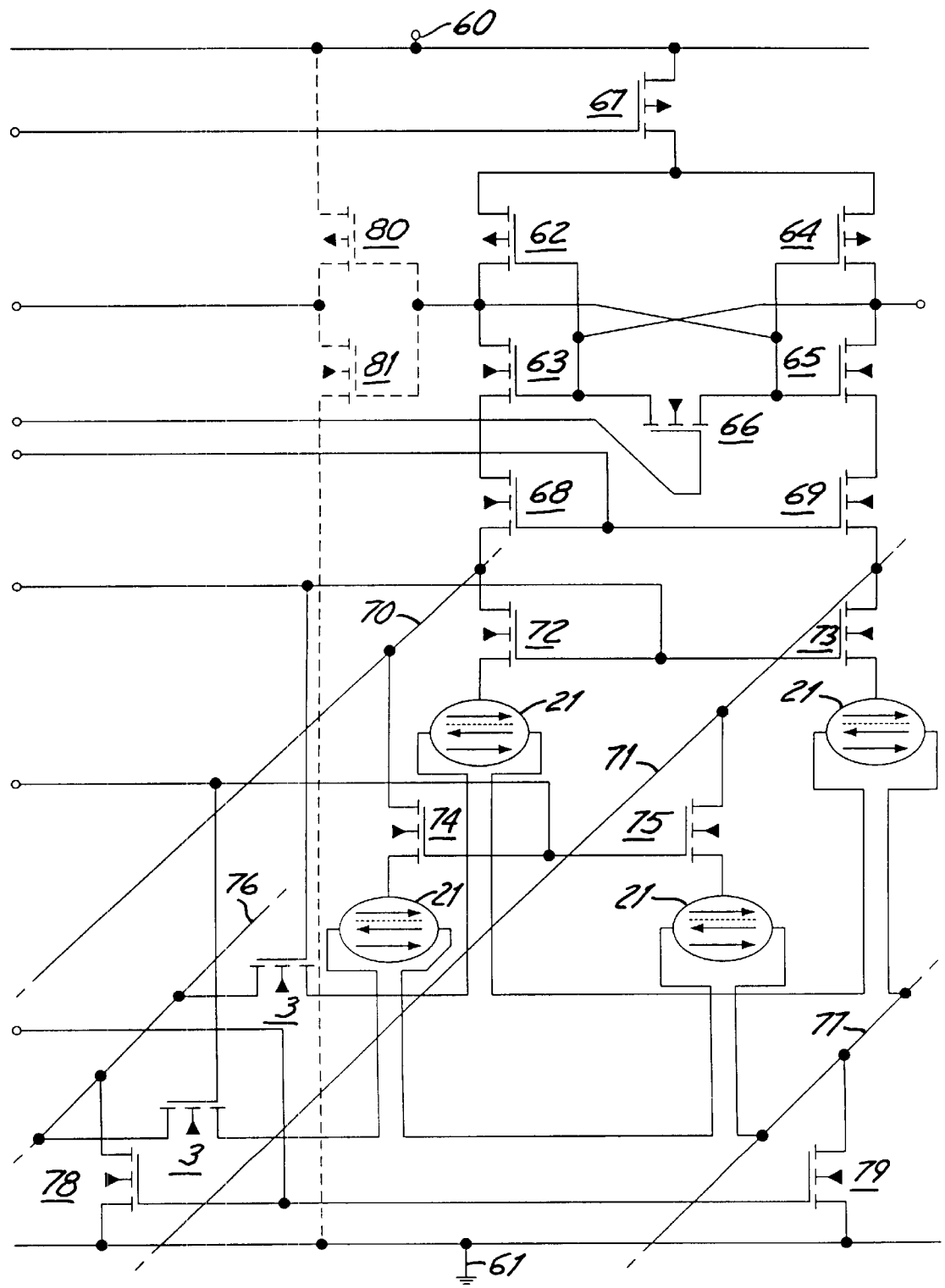
FIG. 10 shows a memory cell selection circuit based on using circuit switching to select a memory cell and obtain information therefrom.

In determining the magnetic state of the ferromagnetic layers in the substitute "sandwich" structure of the FIG. 6 memory cell structures 21 for stored data retrieval, a flip-flop arrangement has been found to be suitable. FIG. 10 illustrates an implementation in CMOS circuitry operated between a terminal, 60, suited for connection to a positive source of voltage and a ground reference voltage terminal, 61, which employs two memory cell structures 21 for each binary bit of stored information as in FIG. 8B. A remote reference cell can be used instead of an additional complementary reference cell structure in the cell to increase density but at the expense of smaller output signal values and so slower retrieval rates as needed to maintain the bit energy to noise power ratio. The substrates of all p-channel MOSFET's in FIG. 10 are connected to terminal 60 though not so shown in that figure, and the substrates of all n-channel MOSFET's in FIG. 10 are connected to terminal 61 though also not so shown in that figure.

In this circuitry of FIG. 10, two selectively cross-coupled CMOS NAND logic gate circuits formed of a first p-channel and n-channel MOSFET inverter connected pair, 62 and 63, adjacent the dashed line MOSFET pair to be described below, and of a second p-channel and n-channel MOSFET inverter connected pair, 64 and 65, to the right of the first pair, are used to selectively form the flip-flop circuit arrangement. The commonly connected drains of first pair MOSFET's 62 and 63 are connected to the commonly connected gates of second pair MOSFET's 64 and 65 which are also connected to one side of an enablement n-channel MOSFET, 66, and the commonly connected drains of second pair MOSFET's 64 and 65 are connected to the commonly connected gates of first pair MOSFET's 62 and 63 which are also connected to the other side of n-channel MOSFET 66. The commonly connected sources of p-channel MOSFET's 62 and 64 are connected to the drain of a p-channel MOSFET, 67, having its source connected to terminal 60.

P-channel MOSFET 67, in being connected to the sources of p-channel MOSFET's 62 and 64 in each of the NAND logic gates of the flip-flop circuit arrangement, serves as an injector transistor in being used with a reference voltage on its gate to limit the current provided to the flip-flop circuit from the voltage supply connected to its source, and so to the memory cell structures 21 connected thereto as described below, so as to not damage those elements. The injection current value is set so that 100 to 150 mV is provided across each of the memory cell structures 21 during the beginning of a data retrieval process while the flip-flop circuit is prevented from normal operation.

The FIG. 6 memory cell structures 21, schematically drawn as ellipses in FIG. 10, are inserted in the ground connection circuitry of the two NAND gates, through a pair of data retrieval operation selection n-channel MOSFET's, 68 and 69, each having its drain connected to the source of a corresponding one of the n-channel MOSFET's in the two NAND logic gates of the flip-flop circuit arrangement, and each having its source connected to a corresponding one of a pair of "read rails", 70 and 71, shown as the upper pair of slanted lines in FIG. 10. These "read rails" have the drains of cell retrieval selection n-channel MOSFET's, 72, 73, 74 and 75, connected thereto (the drains of transistors 72 and 74 connected to rail 70 and the drains of transistors 73 and 75 connected to rail 71 which rails are indicated to extend to other such cell retrieval selection transistors not shown) with such cell retrieval selection transistors being used to select individual ones of the memory cell structures 21. Thus, each of these cell retrieval selection transistors has a single one of the memory cell structures 21 connected to its source with the other side of each such memory cell structure 21 being connected to a corresponding one of a pair of "write rails", 76 and 77, (through an added storage selection transistor to rail 76 to be described below) shown as the lower pair of slanted lines in FIG. 10 (which are indicated to extend to other such storage selection transistors and memory cell structures not shown, and where these storage selection transistors are selection transistors 3 in FIGS. 2 and 3 with rail 76 being the drain connection of transistors 2A and 2B and rail 77 being the drain connection of transistors 2C and 2D in FIG. 3). Each of "write rails" 76 and 77 can be selectively connected to ground during a data retrieval operation by the corresponding one of two n-channel MOSFET's, 78 and 79, shown in FIG. 10 with a drain of each connected to one of rails 76 and 77, their sources connected to terminal 61 and their commonly connected gates connected to a control signal source.

Enablement n-channel MOSFET 66 connects together the transistor gates from the NAND logic gate on one side of the flip-flop circuit arrangement to the transistor gates from the NAND logic gate on the other side of the flip-flop circuit arrangement, and connects together the outputs of each of these NAND gates, to selectively form a short circuit therebetween so that when this transistor is switched into the "on" condition the flip-flop circuit arrangement cannot latch. The limited injection current provided by injector p-channel MOSFET 67 as indicated above is distributed between the two selected memory cell structures 21 with enablement transistor 66 switched on in relation to their resistance values. Once the injection current stabilizes after its provision following selection of a data retrieval operation through switching on the appropriate pair of data retrieval operation selection transistors therefor at the commonly connected gates thereof, and following cell selection by switching on the appropriate pair of cell retrieval selection transistors at the commonly connected gates thereof to thereby select the corresponding pair of memory cell structures 21 to have their magnetic states determined, enablement transistor 66 is switched into the "off" condition. The flip-flop circuit then latches with the low voltage output value side of the flip-flop circuit, i.e. the one of the pair of the flip-flop circuit NAND gates having the lowest output voltage, being the one corresponding to the low resistance one of the selected pair of memory cell structures 21.

A driver inverter in dashed line form provided by a p-channel and n-channel MOSFET inverter connected pair, 80 and 81, having commonly connected drains and gates with the sources thereof connected to terminals 60 and 61, is shown connected by those gates to left one of the memory cell outputs taken at the connected drains of the transistors in the left one of the flip-flop circuit NAND gates. This driver inverter serves as a buffer to provide sufficient output current in those situations in which it is needed, and a further similar one can provided at the other such memory cell output if desired.

The time required to stabilize the injection current following selection of the cell, set by the time enablement transistor 66 is in the "on" condition, depends on the resistance-capacitance time constant of memory cell structures 21 and the parasitic capacitances of the memory cell structures 21 and cell structure interconnection circuitry. As indicated above, enablement transistor 66 is left on until the injection circuit stabilizes. Once enablement transistor 66 is shut off, the flip-flop circuit only requires a few nanoseconds to latch the result.

Figure 11:
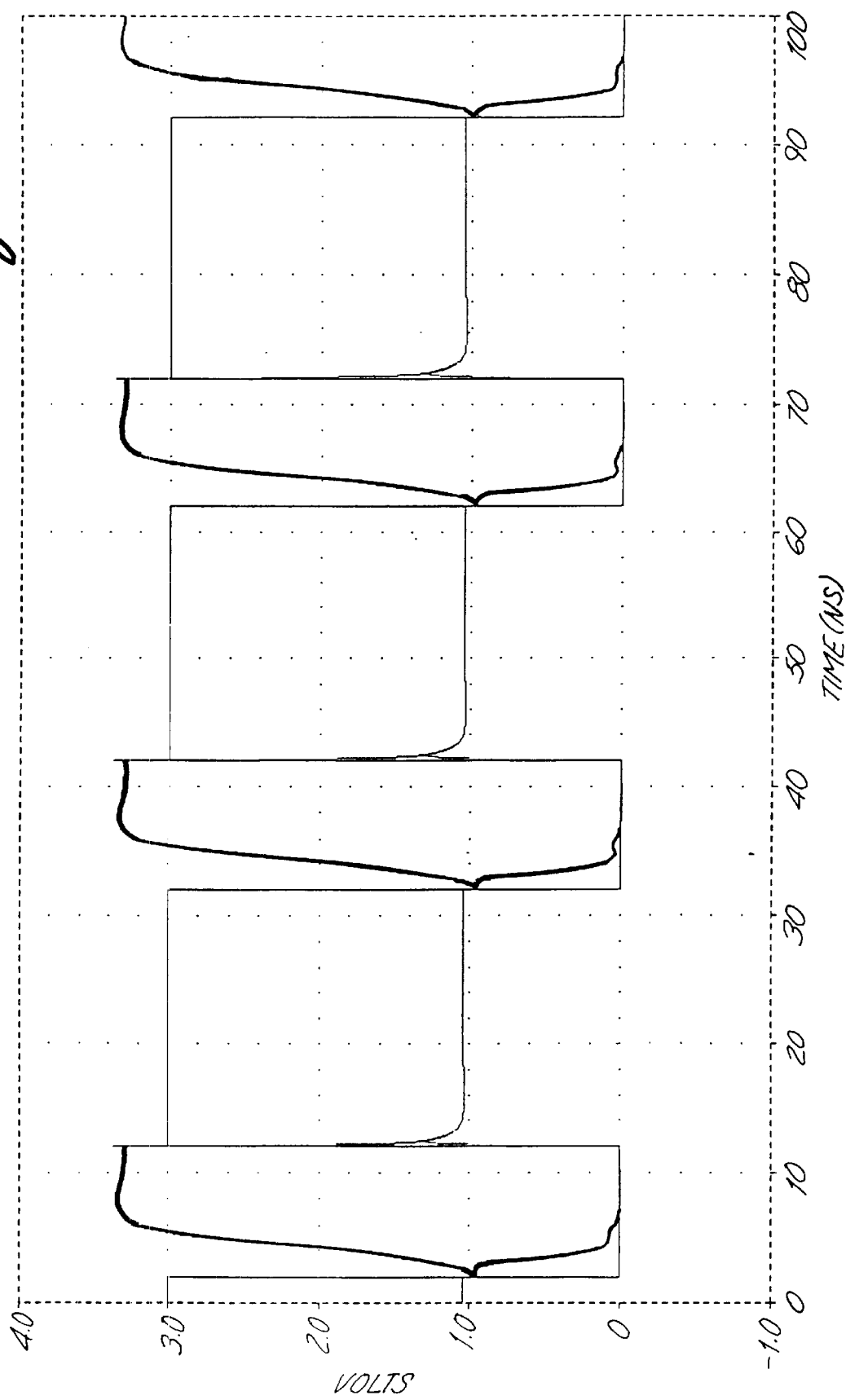
FIG. 11 shows a plot representing the behavior of the circuit of FIG. 10.

FIG. 11 shows a simulated performance assuming the barrier junction material in memory cell structures 21 has a resistance of 100K ohms per square micron and that the barrier junctions have an area of 4 to 5 square microns. The injected sense current is 10 microamps, or about 5 microamps per memory cell structure 21. As a worse case, the magnetoresistance change with changes in the substitue "sandwich" structure magnetic states is assumed to be about 10%. In this simulation, enablement transistor 66 is switched into the "on" condition for 4 nanoseconds and the flip-flop circuit latches within 4 nanoseconds after enablement transistor 66 is turned off.

Figure 12:
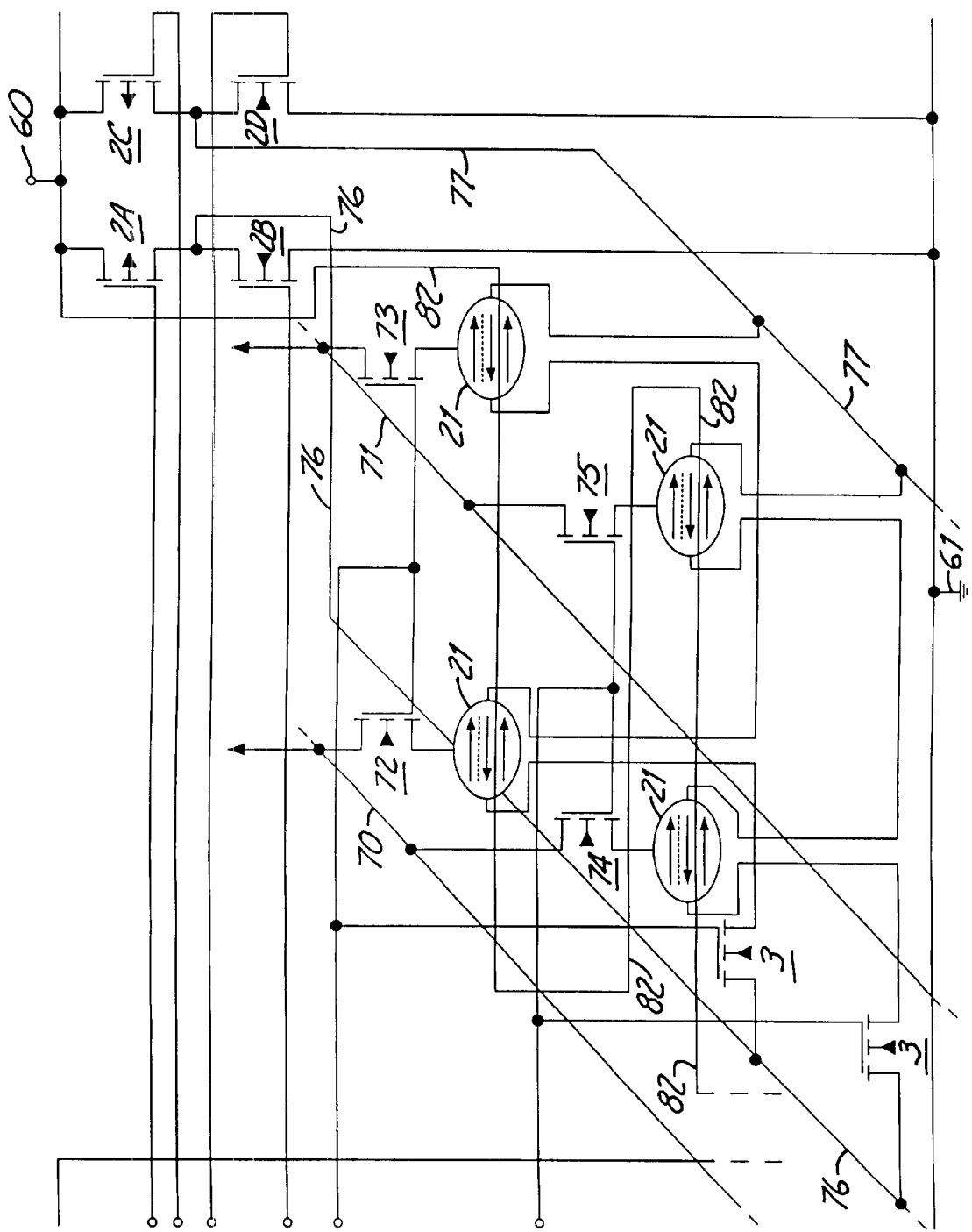
FIG. 12 shows a memory cell selection circuit based on using circuit switching to select a memory cell and store information therein.

The configuration of the data storage circuitry of FIG. 10 associated with the memory cell structure 21 of the memory cells shown in FIG. 6 has been indicated above but is shown in more detail in another alternative in FIG. 12 in which a pair of upward pointing arrows indicate where the cell retrieval selection transistor drains are connected to the corresponding sources of the data retrieval operation selection transistors of FIG. 10. Data retrieval operation selection transistors 68 and 69 of FIG. 10 are switched off during the data storage process so that excessive voltage does not appear across the retrieval circuitry associated with the memory cell structures 21 of the memory cells. In this way a common gate line can be used to switch on cell retrieval selection transistors 72, 73, 74 and 75 and the corresponding storage selection transistors 3 for both the data retrieval and data storage operations at the same time in either operation and thereby save cell area. In addition, grounding transistors 78 and 79 for "write rails" 76 and 77 in FIG. 10 are switched off for data storage operations.

The end of "write rail" 76 in FIG. 12 is connected to the common drain junction of the pair of transistors 2A and 2B of FIG. 3 as shown in FIG. 12, and the end of "write rail" 77 is connected to the common drain junction of the pair of transistors 2C and 2D of FIG. 3 also as shown in FIG. 12 which pairs of transistors are operated together as an "H" switch to provide current through the pairs of memory cell structures 21 in a memory cell selected by the corresponding storage selection transistor 3. The sources of each of the p-channel transistors in these pairs are connected to positive voltage supply terminal 60 and the sources of each of the n-channel transistors in these pairs are connected to ground reference terminal 61. Such an "H" switch can force write current in either direction through the pair of memory cell structures 21 connected to these rails by the corresponding storage selection transistors to set either a binary "1" or "0" magnetic state, or resistance state, therein through having each set of p-channel and the n-channel transistors in opposite pairs placed in opposite conduction states (on or off) by control signals applied to the gates of these transistors. Storage selection transistor 3 in series with each corresponding pair of memory cell structures 21 is used to select them to have a storage current established in them by the "H" switch.

During the data storage process, the storage current required through the substitute "sandwich" structure in the FIG. 6 memory cell structures 21 to set the desired direction of the magnetizations in the ferromagnetic layers therein can be diminished by using an external magnetic bias field as indicated above in connection with FIG. 9A. The current drawn from the voltage power supply through the "H" switch is also used to provide the magnetic bias field along the length of the memory cell structures 21 perpendicular to the easy axes thereof by positioning the voltage supply bus as a current strap, 82, over those elements as indicated in FIGS. 9A and 12 (which is indicated to extend over other such memory cells not shown in FIG. 12). The current in strap 82 is limited to the value of the current drawn through any operating "H" switch which is controlled by the control signals on the gates of the "H" switch transistors. The current through strap 82 always flows in the same direction to tip the magnetization vectors at the center of the ferromagnetic layers away from the easy axes thereof thereby reducing the magnetic field needed to be supplied by the write current to complete the switching of these magnetization vectors to the opposite direction.

Although the present invention has been described with reference to preferred embodiments, workers skilled in the art will recognize that changes may be made in form and detail without departing from the spirit and scope of the invention.

What is claimed is:

1. A ferromagnetic thin-film based digital data memory cell, said memory cell comprising:
   a substrate; and
   a bit structure supported on said substrate comprising:
      a nonmagnetic intermediate layer, said nonmagnetic intermediate layer having two major surfaces on opposite sides thereof;
      a memory film of an anisotropic ferromagnetic material on each of said nonmagnetic intermediate layer major surfaces;
      an electrically insulative intermediate layer on said memory film and across said memory film from one of said nonmagnetic intermediate layer major surfaces, said electrically insulative intermediate layer having a major surface on a side thereof opposite said memory film; and
      a magnetization reference layer on said major surface of said electrically insulative layer having an antiferromagnetic material therein to provide said magnetization reference layer with a relatively fixed magnetization direction.

2. The apparatus of claim 1 wherein a said memory film and said nonmagnetic intermediate layer have a length along a selected direction and a width substantially perpendicular thereto that is smaller in extent than said length, said memory film in said bit structure being characterized by an anisotropy field, and said width being sufficiently small that demagnetization fields arising in said memory film in response to its saturation magnetization being oriented along that said width exceed in magnitude said anisotropy field.

3. The apparatus of claim 1 wherein a said memory film and said nonmagnetic intermediate layer together have a length along a selected direction and a width substantially perpendicular thereto that is smaller in extent than said length and together have a shaped end portion extending over a portion of said length in which said width gradually reduces to zero at that end thereof.

4. The apparatus of claim 1 wherein said memory film at each of said major surfaces of said nonmagnetic intermediate layer of said bit structure is arranged such that there are two separate films with one of said separate films on each of said major surfaces.

5. The apparatus of claim 1 further comprising information retrieval circuitry electrically connected to said bit structure for determining directions of magnetizations of said memory film on each of said intermediate layer surfaces and wherein said electrically insulative intermediate layer major surface adjacent said memory film has a surface area sufficiently large to provide at least that signal-to-noise ratio needed by said information retrieval circuitry to permit determinations thereby of directions of magnetizations of said memory film on each of said intermediate layer surfaces.

6. The apparatus of claim 1 wherein said magnetization reference layer comprises an antiferromagnetic layer positioned at a major surface of a first reference ferromagnetic thin-film layer.

7. The apparatus of claim 1 further comprising an electrical current conductor positioned across an insulating layer from said bit structure.

8. The apparatus of claim 4 wherein said bit structure has a length along selected direction and a width substantially perpendicular thereto that is smaller in extent than said length, said width being less than about two curling lengths of said separate films from edges thereof substantially perpendicular to said width.

9. The apparatus of claim 6 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

10. A ferromagnetic thin-film based digital memory, said memory comprising:
    a plurality of bit structures interconnected with manipulation circuitry having a plurality of transistors so that each said bit structure has a selection transistor in said plurality of transistors electrically coupled thereto that selectively substantially prevents current in at least one direction along a current path through that bit structure and said manipulation circuitry further includes storage switching transistors in said plurality of transistors to permit selecting a direction of current flow through a said bit structure if current is permitted to be established therein by said selection transistor coupled thereto, each said bit structure comprising:
    a nonmagnetic intermediate layer, said nonmagnetic intermediate layer having two major surfaces on opposite sides thereof; and
    a memory film of an anisotropic ferromagnetic material on each of said nonmagnetic intermediate layer major surfaces.

11. The apparatus of claim 10 further having a substrate supporting said plurality of bit structures and wherein each said bit structure in said plurality thereof further comprises an electrically insulative intermediate layer on said memory film and across said memory film from one of said nonmagnetic intermediate layer major surfaces, said electrically insulative intermediate layer having a major surface on a side opposite said memory film, and a magnetization reference layer on said major surface of said electrically insulative intermediate layer having a fixed magnetization direction.

12. The apparatus of claim 10 further having a substrate supporting said plurality of bit structures and wherein each said bit structure in said plurality thereof further comprises an antiferromagnetic layer positioned on said memory film and across said memory film from one of said nonmagnetic intermediate layer major surfaces.

13. The apparatus of claim 10 further having a substrate supporting said plurality of bit structures and wherein each said bit structure in said plurality thereof further comprises said nonmagnetic intermediate layer forming a closed loop about an opening therethrough with said intermediate layer having said two major surfaces on opposite sides thereof between which said opening extends, and wherein said memory film on each of said intermediate layer major surfaces forms a closed loop about said opening, and further comprising a magnetization direction fixing layer about said opening adjacent said memory film and across said memory film from one of said intermediate layer major surfaces.

14. The apparatus of claim 11 further comprising a corresponding electrical current conductor positioned across an insulating layer from each of said bit structures in said plurality thereof.

15. The apparatus of claim 11 wherein said manipulation circuitry further includes retrieval switching transistors in said plurality of transistors to permit selecting establishment of current flow through said electrically insulative intermediate layer.

16. The apparatus of claim 15 comprising a further bit structure having an electrically insulative intermediate layer therein on a memory film of an anisotropic ferromagnetic material, said further bit structure and a said bit structure in said plurality thereof each being electrically connectable to a corresponding one of a pair of logic gates forming a flip-flop circuit in which each of said logic gates has an output thereof electrically connected to an input of that one remaining.

17. The apparatus of claim 16 further comprising a current controller for controlling magnitudes of electrical currents therethrough that electrically connects said flip-flop circuit to a terminal arrangement suited for connection to a source of voltage.

18. A ferromagnetic thin-film based digital memory, said memory comprising:
    a plurality of bit structures interconnected with manipulation circuitry, each said bit structure having an electrically insulative intermediate layer therein on a memory film of an anisotropic ferromagnetic material;
    a flip-flop circuit in said manipulation circuitry formed of a pair of logic gates with each of said logic gates having an output thereof electrically connected to an input of that one remaining, a data bit structure in said plurality of bit structures being selectively electrically connected to a corresponding one of said pair of logic gates; and
    a current controller for controlling magnitudes of electrical currents therethrough that electrically connects said flip-flop circuit to a terminal arrangement suited for connection to a source of voltage.

19. The apparatus of claim 18 comprising a further bit structure having an electrically insulative intermediate layer therein on a memory film of an anisotropic ferromagnetic material, said further bit structure and said data bit structure in said plurality of bit structures each being selectively electrically connected to a corresponding one of said pair of logic gates.

20. The apparatus of claim 18 wherein said data bit structure further has a nonmagnetic intermediate layer having two major surfaces on opposite sides thereof with said memory film on each of said nonmagnetic intermediate layer major surfaces along with said electrically insulative intermediate layer having a major surface on a side thereof opposite said memory film, and further comprising a magnetization reference layer on said major surface of said electrically insulative intermediate layer having a relatively fixed magnetization direction.

21. The apparatus of claim 1 wherein a said memory film and said nonmagnetic intermediate layer have a length along a selected direction between first and second end portions thereof and a width substantially perpendicular thereto that is smaller in extent than said length, and further comprising a first electrode interconnection in electrical contact with at least part of said first end portion, a second electrode interconnection in electrical contact with at least part of said second end portion, and a third electrode interconnection in electrical contact with at least part of said magnetization reference layer.

22. The apparatus of claim 3 wherein said shaped end portion is a first shaped end portion and said memory film and said nonmagnetic intermediate layer have a second shaped end portion on another end thereof separated from said first shaped end portion, said second shaped end portion extending over a portion of said length in which said width gradually reduces to zero at said another end thereof.

23. The apparatus of claim 7 wherein a said memory film and said nonmagnetic intermediate layer have a length along a selected direction between first and second end portions thereof and a width substantially perpendicular thereto that is smaller in extent than said length, and said electrical conductor extends across said bit structure along said width.

24. The apparatus of claim 14 wherein a said memory film and said nonmagnetic intermediate layer have a length along a selected direction between first and second end portions thereof and a width substantially perpendicular thereto that Is smaller in extent than said length, and said electrical conductor extends across said bit structure along said width.

25. The apparatus of claim 21 further comprising a transistor electrically connected to a selected one of said first and second electrode interconnections.

26. The apparatus of claim 21 wherein said bit structure is a first bit structure, said memory film is a first bit memory film, said nonmagnetic intermediate layer is a first bit nonmagnetic intermediate layer, said first end portion is a first bit first end portion, and said second end portion is a first bit second end portion, and further comprises a second bit structure supported on said substrate having a second bit nonmagnetic intermediate layer with two major surfaces on opposite sides thereof each provided with a second bit memory film of an anisotropic ferromagnetic material thereon such that said second bit memory film and said second bit nonmagnetic intermediate layer have a length along a selected direction between second bit first and second end portions thereof and a width substantially perpendicular thereto that is smaller in extent than said length, there further being a second bit electrically insulative intermediate layer on said second bit memory film across from one of said second bit nonmagnetic intermediate layer major surfaces with said second bit electrically insulative intermediate layer having a major surface on a side thereof opposite said second bit memory film on which a second bit magnetization reference layer is provided having a relatively fixed magnetization direction, and with said first electrode interconnection also being in electrical contact with at least part of said second bit first end portion.

27. The apparatus of claim 22 further comprising a first electrode interconnection in electrical contact with at least part of said first shaped end portion, a second electrode interconnection in electrical contact with at least part of said second shaped end portion, and a third electrode interconnection in electrical contact with at least part of said magnetization reference layer.

28. The apparatus of claim 22 wherein said width gradually reduces to zero over a greater portion of said length at a selected one of said first and second shaped end portions than at that one remaining.

29. The apparatus of claim 23 further comprising a ferromagnetic material keeper structure extending across said electrical conductor along said length of said bit structure.

30. The apparatus of claim 24 further comprising a ferromagnetic material keeper structure extending across said electrical conductor along said length of said bit structure.

31. The apparatus of claim 25 further comprising a transistor electrically connected to said third electrode interconnection.

32. The apparatus of claim 26 wherein said second electrode interconnection is also in electrical contact with at least part of said second bit second end portion.

33. The apparatus of claim 27 further comprising a transistor electrically connected to a selected one of said first and second electrode interconnections.

34. The apparatus of claim 27 wherein said bit structure is a first bit structure, said memory film is a first bit memory film, said nonmagnetic intermediate layer is a first bit nonmagnetic intermediate layer, said first shaped end portion is a first bit first shaped end portion, and said second shaped end portion is a first bit second shaped end portion, and further comprises a second bit structure supported on said substrate having a second bit nonmagnetic intermediate layer with two major surfaces on opposite sides thereof each provided with a second bit memory film of an anisotropic ferromagnetic material thereon such that said second bit memory film and said second bit nonmagnetic intermediate layer have a length along a selected direction between second bit first and second shaped end portions thereof and a width substantially perpendicular thereto that is smaller in extent than said length, there further being a second bit electrically insulative intermediate layer on said second bit memory film across from one of said second bit nonmagnetic intermediate layer major surfaces with said second bit electrically insulative intermediate layer having a major surface on a side thereof opposite said second bit memory film on which a second bit magnetization reference layer is provided having a relatively fixed magnetization direction, and with said first electrode interconnection also being in electrical contact with at least part of said second bit first shaped end portion.

35. The apparatus of claim 33 further comprising a transistor electrically connected to said third electrode interconnection.

36. The apparatus of claim 34 wherein said second electrode interconnection is also in electrical contact with at least part of said second bit second shaped end portion.

37. A ferromagnetic thin-film based digital memory cell, said memory cell comprising:
   a substrate; and
   a bit structure supported on said substrate comprising:
      a first nonmagnetic intermediate layer formed of an electrically conductive material, said first nonmagnetic intermediate layer having two major surfaces on opposite sides thereof;
      an initial memory film of an anisotropic ferromagnetic material on each of said first nonmagnetic intermediate layer major surfaces;

an electrically insulative intermediate layer on said initial memory film and across said initial memory film from one of said first nonmagnetic intermediate layer major surfaces, said electrically insulative intermediate layer having a major surface on a side thereof opposite said initial memory film; and a magnetization reference layer on said major surface of said electrically insulative layer, said magnetization reference layer having a relatively fixed magnetization direction.

38. The apparatus of claim 37 wherein a said initial memory film and said first nonmagnetic intermediate layer have a length along a selected direction between first and second end portions thereof and a width substantially perpendicular thereto that is smaller in extent than said length, and further comprising a first electrode interconnection in electrical contact with at least part of said first end portion, a second electrode interconnection in electrical contact with at least part of said second end portion, and a third electrode interconnection coupled to said magnetization reference layer.

39. The apparatus of claim 37 wherein a said initial memory film and said first nonmagnetic intermediate layer together have a length along a selected direction and a width substantially perpendicular thereto that is smaller in extent than said length and together have a shaped end portion extending over a portion of said length in which said width gradually reduces to zero at that end thereof.

40. The apparatus of claim 37 further comprising an electrical current conductor positioned across an insulating layer from said bit structure.

41. The apparatus of claim 38 further comprising a transistor electrically connected to a selected one of said first and second electrode interconnections.

42. The apparatus of claim 38 wherein said bit structure is a first bit structure, said initial memory film is a first bit initial memory film, said first nonmagnetic intermediate layer is a first bit first nonmagnetic intermediate layer, said first end portion is a first bit first end portion, and said second end portion is a first bit second end portion, and further comprises a second bit structure supported on said substrate having a second bit first nonmagnetic intermediate layer with two major surfaces on opposite sides thereof each provided with a second bit initial memory film of an anisotropic ferromagnetic material thereon such that said second bit initial memory film and said second bit first nonmagnetic intermediate layer have a length along a selected direction between second bit first and second end portions thereof and a width substantially perpendicular thereto that is smaller in extent than said length, there further being a second bit electrically insulative intermediate layer on said second bit memory film across from one of said second bit nonmagnetic intermediate layer major surfaces with said second bit electrically insulative intermediate layer having a major surface on a side thereof opposite said second bit initial memory film on which a second bit magnetization reference layer is provided having a relatively fixed magnetization direction, and with said first electrode interconnection also being in electrical contact with at least part of said second bit first end portion.

43. The apparatus of claim 39 wherein said shaped end portion is a first shaped end portion and said initial memory film and said first nonmagnetic intermediate layer have a second shaped end portion on another end thereof separated from said first shaped end portion, said second shaped end portion extending over a portion of said length in which said width gradually reduces to zero at said another end thereof.

44. The apparatus of claim 40 further comprising a ferromagnetic material keeper structure extending across said electrical conductor along said length of said bit structure.

45. The apparatus of claim 41 further comprising a transistor electrically connected to said third electrode interconnection.

46. The apparatus of claim 43 further comprising a first electrode interconnection in electrical contact with at least part of said first shaped end portion, a second electrode interconnection in electrical contact with at least part of said second shaped end portion, and a third electrode interconnection coupled to said magnetization reference layer.

47. The apparatus of claim 46 further comprising a transistor electrically connected to a selected one of said first and second electrode interconnections.

48. The apparatus of claim 46 wherein said bit structure is a first bit structure, said initial memory film is a first bit initial memory film, said first nonmagnetic intermediate layer is a first bit first nonmagnetic intermediate layer, said first shaped end portion is a first bit first shaped end portion, and said second shaped end portion is a first bit second shaped end portion, and further comprises a second bit structure supported on said substrate having a second bit first nonmagnetic intermediate layer with two major surfaces on opposite sides thereof each provided with a second bit initial memory film of an anisotropic ferromagnetic material thereon such that said second bit initial memory film and said second bit first nonmagnetic intermediate layer have a length along a selected direction between second bit first and second shaped end portions thereof and a width substantially perpendicular thereto that is smaller in extent than said length, there further being a second bit electrically insulative intermediate layer on said second bit memory film across from one of said second bit nonmagnetic intermediate layer major surfaces with said second bit electrically insulative intermediate layer having a major surface on a side thereof opposite said second bit initial memory film on which a second bit magnetization reference layer is provided having a relatively fixed magnetization direction, and with said first electrode interconnection also being in electrical contact with at least part of said second bit first shaped end portion.

49. The apparatus of claim 47 further comprising a transistor electrically connected to said third electrode interconnection.

50. The apparatus of claim 1 wherein said nonmagnetic intermediate layer is formed of an electrically conductive material.

51. The apparatus of claim 1 further comprising a plurality of electrode interconnections made to at least corresponding selected portions of that structure formed on one side of said electrically insulative intermediate layer by said nonmagnetic intermediate layer with said memory film thereon.

52. The apparatus of claim 10 wherein said substrate further comprises a monolithic integrated circuit structure containing at least one of said plurality of transistors.

53. The apparatus of claim 11 wherein said magnetization reference layer in each said bit structure in said plurality thereof comprises an antiferromagnetic layer positioned at a major surface of a first reference ferromagnetic thin-film layer and a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

54. The apparatus of claim 14 wherein said plurality of bit structures are each supported on a substrate and separated from one another by spacer material therebetween, and wherein a magnetic material layer in said magnetization reference layer has a characteristic magnetic property that is maintained below a critical temperature above which such magnetic property is not maintained, said bit structures each having a first interconnection structure providing electrical contact thereto positioned against at least one side thereof, and said electrical conductor exhibits sufficient electrical resistance where across from a said bit structure for a sufficient electrical current therethrough to cause substantial heating of said bit structure to raise temperatures thereof to have said magnetic material layer therein approach said critical temperature thereof while being substantially above temperatures of at least an adjacent said bit structure because of sufficient extents of, and smallness of thermal conductivities of, said first interconnection structure positioned against said bit structure and of those portions of said substrate and said spacer material positioned thereabout.

55. The apparatus of claim 15 wherein said manipulation circuitry further comprises information retrieval circuitry including said retrieval switching transistors in said plurality of transistors that is electrically connected to said bit structures in said plurality thereof for determining directions of magnetizations of said memory film on each corresponding one of said intermediate layer surfaces and wherein each corresponding said electrically insulative intermediate layer major surface adjacent said memory film therein has a surface area sufficiently large to provide at least that signal-to-noise ratio needed by said information retrieval circuitry to permit determinations thereby of directions of magnetizations of said memory film on each of those said intermediate layer surfaces.

56. The apparatus of claim 16 wherein said substrate further comprises a monolithic integrated circuit structure containing at least a portion of said flip-flop circuit.

57. The apparatus of claim 17 wherein said substrate further comprises a monolithic integrated circuit structure containing at least a portion of said current controller.

58. The apparatus of claim 18 wherein said plurality of bit structures are each supported on a substrate and said substrate further comprises a monolithic integrated circuit structure containing at least a portion of said current controller.

59. The apparatus of claim 21 wherein said substrate further comprises a monolithic integrated circuit structure containing electronic circuit components of which at least one is electrically connected to one of said electrodes.

60. The apparatus of claim 37 wherein said magnetization reference layer is formed from a second nonmagnetic intermediate layer having two major surfaces on opposite sides thereof and an opposite side memory film provided on each of said second nonmagnetic intermediate layer major surfaces.

61. The apparatus of claim 37 further comprising information retrieval circuitry electrically connected to said bit structure for determining directions of magnetizations of said memory film on each of said intermediate layer surfaces and wherein said electrically insulative intermediate layer major surface adjacent said memory film has a surface area sufficiently large to provide at least that signal-to-noise ratio needed by said information retrieval circuitry to permit determinations thereby of directions of magnetizations of said memory film on each of said intermediate layer surfaces.

62. The apparatus of claim 41 wherein said substrate further comprises a monolithic integrated circuit structure containing said transistor.

63. The apparatus of claim 45 wherein said substrate further comprises a monolithic integrated circuit structure containing both of said transistors.

64. The apparatus of claim 47 wherein said substrate further comprises a monolithic integrated circuit structure containing said transistor.

65. The apparatus of claim 49 wherein said substrate further comprises a monolithic integrated circuit structure containing both of said transistors.

66. The apparatus of claim 55 wherein said substrate further comprises a monolithic integrated circuit structure containing at least one of said plurality of transistors.

67. The apparatus of claim 58 wherein said monolithic integrated circuit structure substrate also contains at least a portion of said flip-flop circuit.

68. The apparatus of claim 60 wherein said magnetization reference layer has an antiferromagnetic material therein.

69. The apparatus of claim 68 wherein said second nonmagnetic intermediate layer is an antiparallel magnetization directing layer forcing magnetizations of said opposite side memory film provided on each of said second nonmagnetic intermediate layer major surfaces to be oppositely directed.

70. A ferromagnetic thin-film based digital data memory cell, said memory cell comprising:
    a substrate; and
    a bit structure supported on said substrate comprising:
        a first nonmagnetic intermediate layer, said first nonmagnetic intermediate layer having two major surfaces on opposite sides thereof;
        an initial memory film of an anisotropic ferromagnetic material on each of said first nonmagnetic intermediate layer major surfaces;
        an electrically insulative intermediate layer on said initial memory film and across said initial memory film from one of said first nonmagnetic intermediate layer major surfaces, said electrically insulative intermediate layer having a major surface on a side thereof opposite said initial memory film;
        a magnetization reference layer on said major surface of said electrically insulative layer, said magnetization reference layer having a relatively fixed magnetization direction; and
        a plurality of electrode interconnections made to at least corresponding selected portions of that structure formed on one s electrically insulative intermediate layer by said first nonmagnetic intermediate layer with said initial memory film thereon.

71. The apparatus of claim 70 wherein said nonmagnetic intermediate layer is formed of an electrically conductive material.

72. The apparatus of claim 70 wherein said magnetization reference layer has an antiferromagnetic material therein.

73. The apparatus of claim 70 wherein a said initial memory film and said first nonmagnetic intermediate layer have a length along a selected direction between first and second end portions thereof and a width substantially perpendicular thereto that is smaller in extent than said length, and further comprising a first electrode interconnection in said plurality of electrode interconnections in electrical contact with at least part of said first end portion, a second electrode interconnection in said plurality of electrode interconnections in electrical contact with at least part of said second end portion, and a third electrode interconnection coupled to said magnetization reference layer.

74. The apparatus of claim 70 wherein a said initial memory film and said first nonmagnetic intermediate layer together have a length along a selected direction and a width substantially perpendicular thereto that is smaller in extent than said length and together have a shaped end portion extending over a portion of said length in which said width gradually reduces to zero at that end thereof.

75. The apparatus of claim 70 further comprising an electrical current conductor positioned across an insulating layer from said bit structure.

76. The apparatus of claim 70 further comprising information retrieval circuitry electrically connected to said bit structure for determining directions of magnetizations of said memory film on each of said intermediate layer surfaces and wherein said electrically insulative intermediate layer major surface adjacent said memory film has a surface area sufficiently large to provide at least that signal-to-noise ratio needed by said information retrieval circuitry to permit determinations thereby of directions of magnetizations of said memory film on each of said intermediate layer surfaces.

77. The apparatus of claim 72 wherein said magnetization reference layer is formed from a second nonmagnetic intermediate layer having two major surfaces on opposite sides thereof and an opposite side memory film provided on each of said second nonmagnetic intermediate layer major surfaces.

78. The apparatus of claim 73 further comprising a transistor electrically connected to a selected one of said first and second electrode interconnections.

79. The apparatus of claim 73 wherein said bit structure is a first bit structure, said initial memory film is a first bit initial memory film, said first nonmagnetic intermediate layer is a first bit first nonmagnetic intermediate layer, said first end portion is a first bit first end portion, and said second end portion is a first bit second end portion, and further comprises a second bit structure supported on said substrate having a second bit first nonmagnetic intermediate layer with two major surfaces on opposite sides thereof each provided with a second bit initial memory film of an anisotropic ferromagnetic material thereon such that said second bit initial memory film and said second bit first nonmagnetic intermediate layer have a length along a selected direction between second bit first and second end portions thereof and a width substantially perpendicular thereto that is smaller in extent than said length, there further being a second bit electrically insulative intermediate layer on said second bit memory film across from one of said second bit nonmagnetic intermediate layer major surfaces with said second bit electrically insulative intermediate layer having a major surface on a side thereof opposite said second bit initial memory film on which a second bit magnetization reference layer is provided having a relatively fixed magnetization direction, and with said first electrode interconnection also being in electrical contact with at least part of said second bit first end portion.

80. The apparatus of claim 74 wherein said shaped end portion is a first shaped end portion and said initial memory film and said first nonmagnetic intermediate layer have a second shaped end portion on another end thereof separated from said first shaped end portion, said second shaped end portion extending over a portion of said length in which said width gradually reduces to zero at said another end thereof.

81. The apparatus of claim 75 further comprising a ferromagnetic material keeper structure extending across said electrical conductor along said length of said bit structure.

82. The apparatus of claim 77 wherein said second nonmagnetic intermediate layer is an antiparallel magnetization directing layer forcing magnetizations of said opposite side memory film provided on each of said second nonmagnetic intermediate layer major surfaces to be oppositely directed.

83. The apparatus of claim 78 further comprising a transistor electrically connected to said third electrode interconnection.

84. The apparatus of claim 78 wherein said substrate further comprises a monolithic integrated circuit structure containing said transistor.

85. The apparatus of claim 80 further comprising a first electrode interconnection in said plurality of electrode interconnections in electrical contact with at least part of said first shaped end portion, a second electrode interconnection in said plurality of electrode interconnections in electrical contact with at least part of said second shaped end portion, and a third electrode interconnection coupled to said magnetization reference layer.

86. The apparatus of claim 83 wherein said substrate further comprises a monolithic integrated circuit structure containing both of said transistors.

87. The apparatus of claim 85 further comprising a transistor electrically connected to a selected one of said first and second electrode interconnections.

88. The apparatus of claim 85 wherein said bit structure is a first bit structure, said initial memory film is a first bit initial memory film, said first nonmagnetic intermediate layer is a first bit first nonmagnetic intermediate layer, said first shaped end portion is a first bit first shaped end portion, and said second shaped end portion is a first bit second shaped end portion, and further comprises a second bit structure supported on said substrate having a second bit first nonmagnetic intermediate layer with two major surfaces on opposite sides thereof each provided with a second bit initial memory film of an anisotropic ferromagnetic material thereon such that said second bit initial memory film and said second bit first nonmagnetic intermediate layer have a length along a selected direction between second bit first and second shaped end portions thereof and a width substantially perpendicular thereto that is smaller in extent than said length, there further being a second bit electrically insulative intermediate layer on said second bit memory film across from one of said second bit nonmagnetic intermediate layer major surfaces with said second bit electrically insulative intermediate layer having a major surface on a side thereof opposite said second bit initial memory film on which a second bit magnetization reference layer is provided having a relatively fixed magnetization direction, and with said first electrode interconnection also being in electrical contact with at least part of said second bit first shaped end portion.

89. The apparatus of claim 87 further comprising a transistor electrically connected to said third electrode interconnection.

90. The apparatus of claim 87 wherein said substrate further comprises a monolithic integrated circuit structure containing said transistor.

91. The apparatus of claim 89 wherein said substrate further comprises a monolithic integrated circuit structure containing both of said transistors.

92. A ferromagnetic thin-film based digital memory supported at least in part on a substrate, said memory comprising:
 a plurality of bit structures interconnected with manipulation circuitry and supported on said substrate each comprising:
  a first nonmagnetic intermediate layer, said first nonmagnetic intermediate layer having two major surfaces on opposite sides thereof;
  an initial memory film of an anisotropic ferromagnetic material on each of said first nonmagnetic intermediate layer major surfaces;

an opposite side memory film of an anisotropic ferromagnetic material; and an electrically insulative intermediate layer between and against both said initial memory film, across said initial memory film from one of said first nonmagnetic intermediate layer major surfaces, and said opposite side memory film; and a flip-flop circuit in said manipulation circuitry formed of a pair of logic gates with each of said logic gates having an output thereof electrically connected to an input of that one remaining, a data bit structure in said plurality of bit structures being selectively electrically connected to a corresponding one of said pair of logic gates.

93. The apparatus of claim 92 comprising a further bit structure having an electrically insulative intermediate layer therein on a memory film of an anisotropic ferromagnetic material, said further bit structure and said data bit structure in said plurality of bit structures each being selectively electrically connected to a corresponding one of said pair of logic gates.

94. The apparatus of claim 92 wherein a said initial memory film and said first nonmagnetic intermediate layer in each of said plurality of bit structures have a length along a selected direction between first and second end portions thereof and a width substantially perpendicular thereto that is smaller in extent than said length, and further comprising a first electrode interconnection in electrical contact with at least part of said first end portion, a second electrode interconnection in electrical contact with at least part of said second end portion, and a third electrode interconnection coupled to said opposite side memory film.

95. The apparatus of claim 92 wherein a said initial memory film and said first nonmagnetic intermediate layer in each of said plurality of bit structures have a length along a selected direction and a width substantially perpendicular thereto that is smaller in extent than said length and has a shaped end portion extending over a portion of said length in which said width gradually reduces to zero at that end thereof.

96. The apparatus of claim 92 further comprising an electrical current conductor positioned across an insulating layer from at least one of said plurality of bit structures.

97. The apparatus of claim 92 with said plurality of bit structures each further comprising a second nonmagnetic intermediate layer with said second nonmagnetic intermediate layer having two major surfaces on opposite sides thereof, and with said opposite side memory film on each of said second nonmagnetic intermediate layer major surfaces, said electrically insulative intermediate layer across said opposite side memory film from one of said second nonmagnetic intermediate layer major surfaces.

98. The apparatus of claim 94 further comprising a transistor electrically connected to a selected one of said first and second electrode interconnections.

99. The apparatus of claim 96 further comprising a ferromagnetic material keeper structure extending across said electrical conductor along said length of said bit structure.

100. The apparatus of claim 98 further comprising a transistor electrically connected to said third electrode interconnection and to said corresponding one of said pair of logic gates.

* * * * *

UNITED STATES PATENT AND TRADEMARK OFFICE
CERTIFICATE OF CORRECTION

PATENT NO. : 6,538,921 B2  Page 1 of 1
DATED : March 25, 2003
INVENTOR(S) : James M. Daughton et al.

It is certified that error appears in the above-identified patent and that said Letters Patent is hereby corrected as shown below:

Title page,
Item [56], OTHER PUBLICATIONS, "A. Veloso, P.P. Freitas, and L.V. Melo." references, delete "Layer", insert -- Layers --

Column 29,
Line 34, delete "Is", insert -- is --

Column 34,
Line 43, delete "s", insert -- side of said --

Signed and Sealed this

First Day of July, 2003

JAMES E. ROGAN
*Director of the United States Patent and Trademark Office*

UNITED STATES PATENT AND TRADEMARK OFFICE
Certificate

Patent No. 6,538,921 B2

Patented: March 25, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: James M. Daughton, Eden Prairie, MN (US); Arthur V. Pohm, Ames, IA (US); and Brenda A. Everitt, Minneapolis, MN (US).

Signed and Sealed this Thirty-first Day of July 2012.

RICHARD ELMS
*Supervisory Patent Examiner*
Art Unit 2824
Technology Center 2800

(12) INTER PARTES REEXAMINATION CERTIFICATE (1262nd)
United States Patent
Daughton et al.

(10) Number: US 6,538,921 C1
(45) Certificate Issued: Apr. 29, 2016

(54) CIRCUIT SELECTION OF MAGNETIC MEMORY CELLS AND RELATED CELL STRUCTURES

(75) Inventors: James M. Daughton, Eden Prairie, MN (US); Arthur V. Pohm, Ames, IA (US); Brenda A. Everitt, Minneapolis, MN (US)

(73) Assignee: NVE CORPORATION, Eden Prairie, MN (US)

Reexamination Request:
No. 95/002,074, Aug. 14, 2012

Reexamination Certificate for:
Patent No.: 6,538,921
Issued: Mar. 25, 2003
Appl. No.: 09/929,435
Filed: Aug. 14, 2001

Certificate of Correction issued Jul. 1, 2003
Certificate of Correction issued Jul. 31, 2012

Related U.S. Application Data

(60) Provisional application No. 60/225,966, filed on Aug. 17, 2000.

(51) Int. Cl.
*G11C 11/14* (2006.01)
*B82Y 10/00* (2011.01)
*G11C 11/15* (2006.01)
*G11C 11/16* (2006.01)
*H01L 27/22* (2006.01)

(52) U.S. Cl.
CPC ............... *B82Y 10/00* (2013.01); *G11C 11/15* (2013.01); *G11C 11/16* (2013.01); *H01L 27/228* (2013.01)

(58) Field of Classification Search
None
See application file for complete search history.

(56) References Cited

To view the complete listing of prior art documents cited during the proceeding for Reexamination Control Number 95/002,074, please refer to the USPTO's public Patent Application Information Retrieval (PAIR) system under the Display References tab.

*Primary Examiner* — Minh T Nguyen

(57) ABSTRACT

A ferromagnetic thin-film based digital memory having a plurality of bit structures interconnected with manipulation circuitry having a plurality of transistors so that each bit structure has transistors electrically coupled thereto that selectively substantially prevents current in at least one direction along a current path through that bit structure and permits selecting a direction of current flow through the bit structure if current is permitted to be established therein. A bit structure has a nonmagnetic intermediate layer with two major surfaces on opposite sides thereof and a memory film of an anisotropic ferromagnetic material on each of the intermediate layer major surfaces with an electrically insulative intermediate layer is provided on the memory film on which a magnetization reference layer is provided having a fixed magnetization direction.

At the time of issuance and publication of this certificate, the patent remains subject to pending reissue application number 14/638,718 filed Mar. 4, 2015. The claim content of the patent may be subsequently revised if a reissue patent is issued from the reissue application.

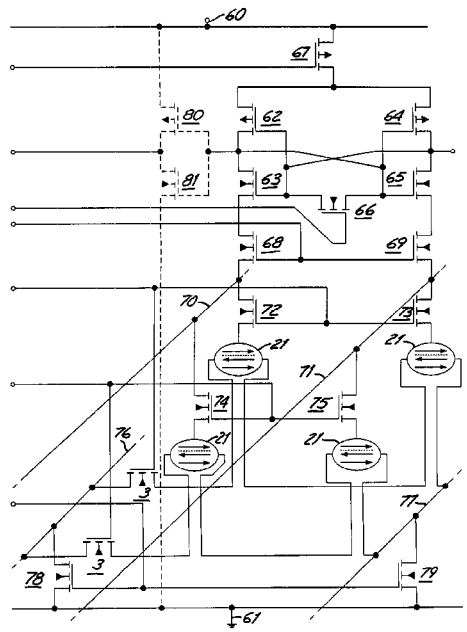

INTER PARTES REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-12, 14-20, 22-24, 29, 30, 37, 39, 40, 43, 44, 50, 52, 53, 55-58, 60, 61, 66-69, 92, 93, 95-97 and 99 are cancelled.

Claims 13, 21, 25-28, 31-36, 38, 41, 42, 45-49, 51, 54, 59, 62-65, 70-91, 94, 98 and 100 were not reexamined.

\* \* \* \* \*